(12) United States Patent
Yang et al.

(10) Patent No.: US 10,466,959 B1
(45) Date of Patent: Nov. 5, 2019

(54) AUTOMATIC VOLUME LEVELER

(71) Applicant: Amazon Technologies, Inc., Seattle, WA (US)

(72) Inventors: Jun Yang, San Jose, CA (US); Zezhang Hou, Cupertino, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/926,443

(22) Filed: Mar. 20, 2018

(51) Int. Cl.
| | |
|---|---|
| *H03G 5/02* | (2006.01) |
| *G06F 3/16* | (2006.01) |
| *G10L 25/51* | (2013.01) |
| *G10L 25/84* | (2013.01) |
| *G10L 25/81* | (2013.01) |
| G10L 25/78 | (2013.01) |

(52) U.S. Cl.
CPC ............ *G06F 3/165* (2013.01); *G10L 25/51* (2013.01); *G10L 25/81* (2013.01); *G10L 25/84* (2013.01); *G10L 2025/783* (2013.01)

(58) Field of Classification Search
CPC ......... G06F 3/165; G10L 25/51; G10L 25/81; G10L 25/84; G10L 2025/783; H03G 3/32; H03G 3/20; H03G 5/165; H03G 9/14; H03G 9/18; H03G 1/00; H03G 9/10; H03G 5/16; H04S 2400/13; H04R 2430/01

USPC ....... 381/107, 104, 106, 102, 103, 109, 119, 381/120; 704/225; 379/388.03, 390.01, 379/395

See application file for complete search history.

(56) References Cited

U.S. PATENT DOCUMENTS

| | | | | |
|---|---|---|---|---|
| 4,514,703 A | * | 4/1985 | Maher ................. | H03G 3/3005 330/134 |
| 2014/0037108 A1 | * | 2/2014 | Christoph ............. | H03G 3/20 381/107 |
| 2016/0049915 A1 | * | 2/2016 | Wang ................... | H03G 3/3089 381/107 |
| 2016/0219387 A1 | * | 7/2016 | Ward .................... | G10L 19/008 |
| 2019/0058939 A1 | * | 2/2019 | Yan ....................... | G06F 3/165 |

* cited by examiner

*Primary Examiner* — Norman Yu

(74) *Attorney, Agent, or Firm* — Pierce Atwood LLP

(57) ABSTRACT

A system that includes an automatic volume leveler (AVL) that processes audio data based on audio category and desired volume level. The system may select different settings for audio data associated with different audio sources (e.g., content providers), audio categories (e.g., types of audio data, such as music, voice, etc.), genres, and/or the like. For example, the system may distinguish between music signals and voice signals (e.g., speech) and may apply a first gain curve for the music and a second gain curve for the speech. Additionally or alternatively, the system may distinguish between different genres of music and may apply different gain curves based on the genre. Further, the system may select a gain curve based on a desired volume level. Therefore, output audio data generated by performing AVL may be optimized based on the audio category, audio source, genre, desired volume level, and/or the like.

21 Claims, 20 Drawing Sheets

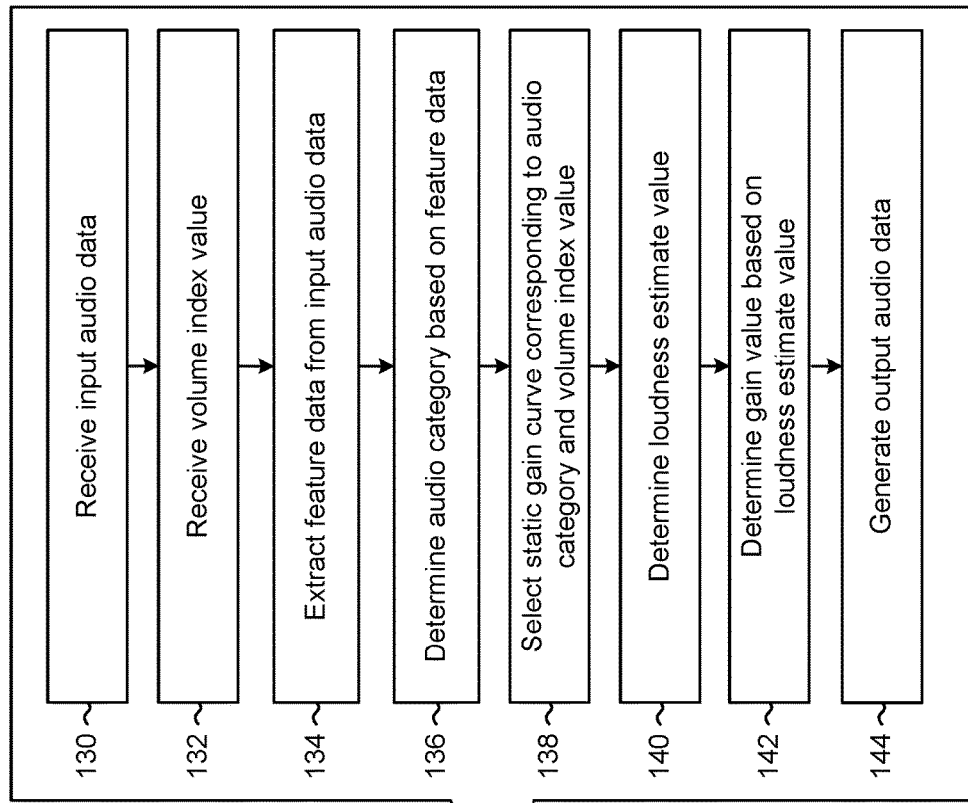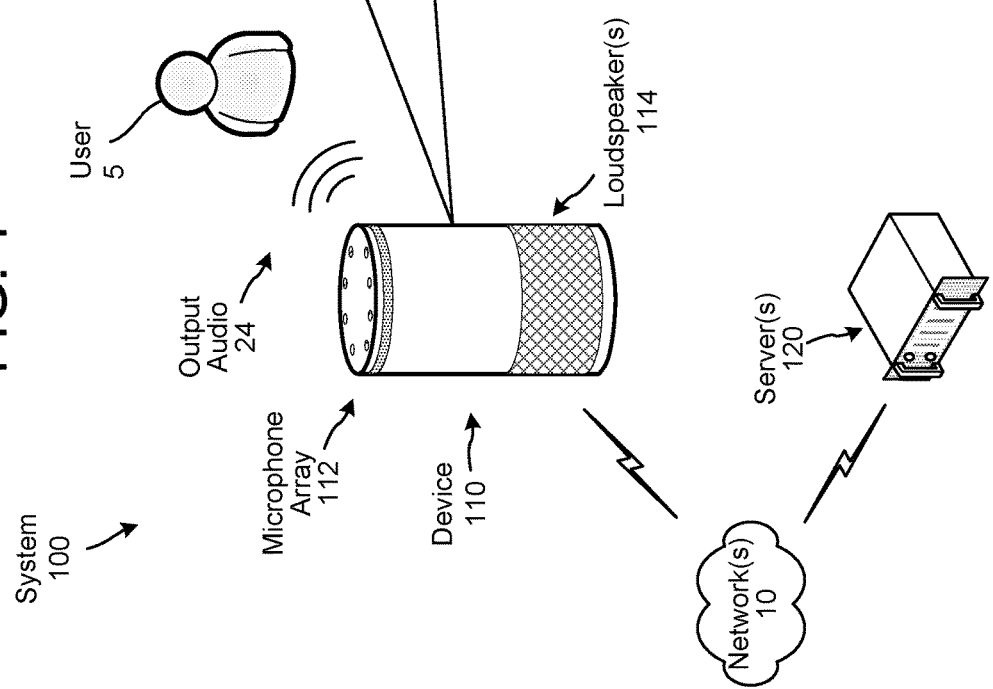

FIG. 2
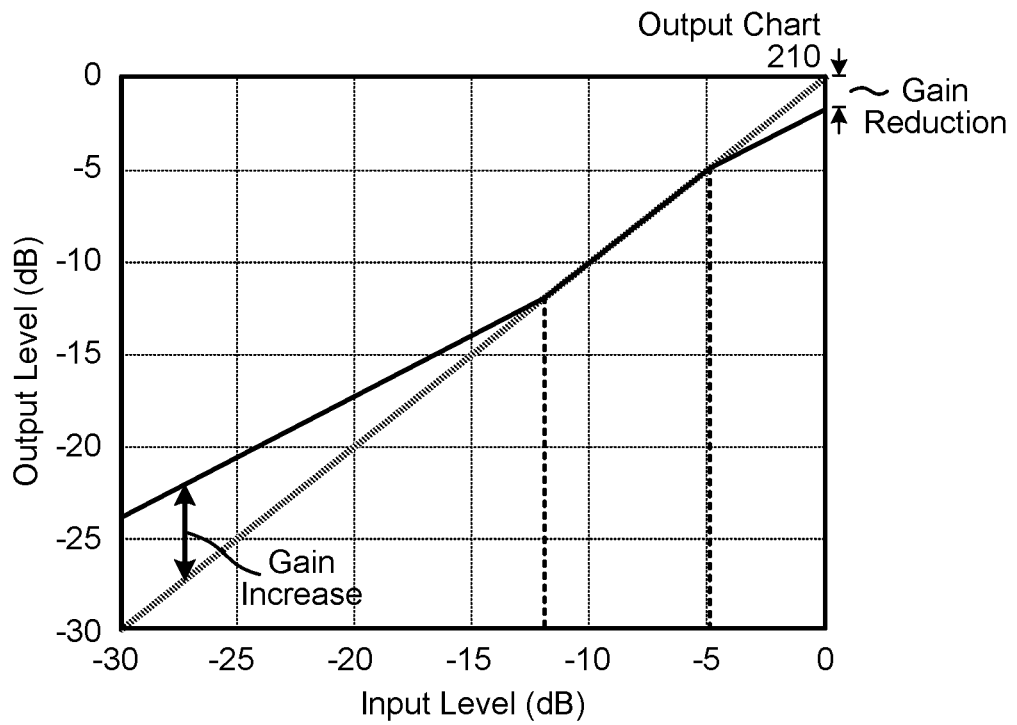
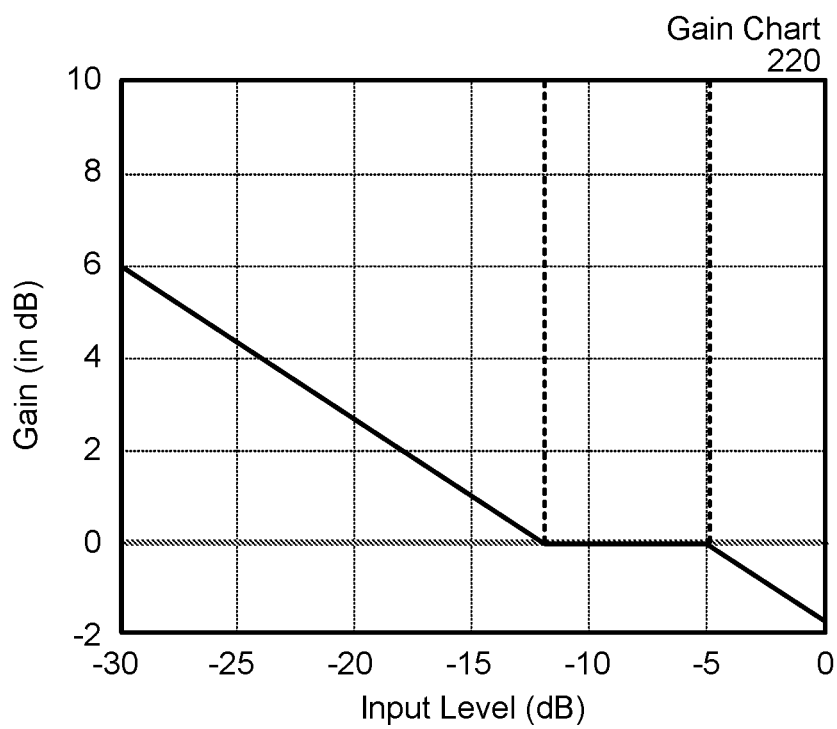

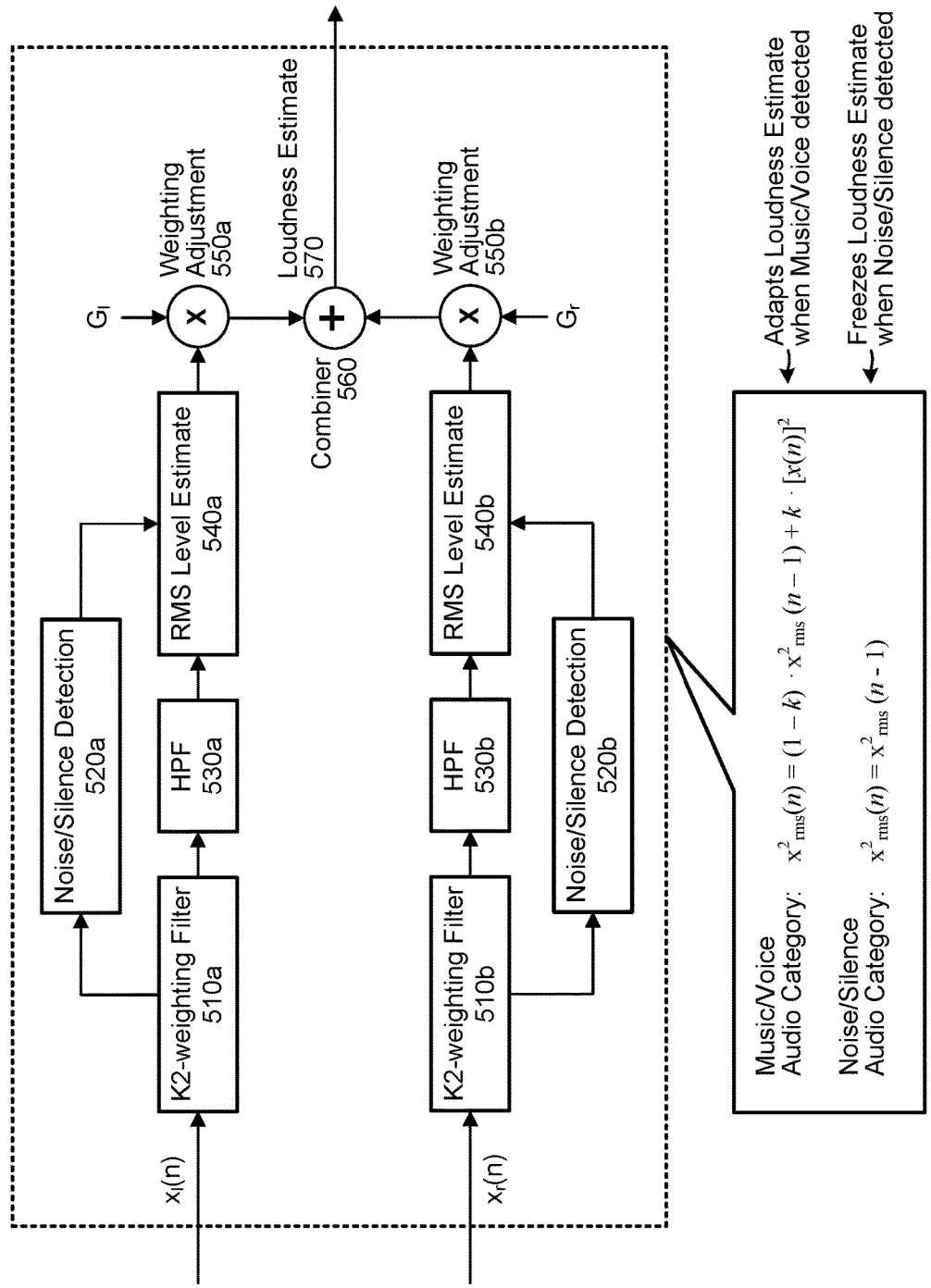

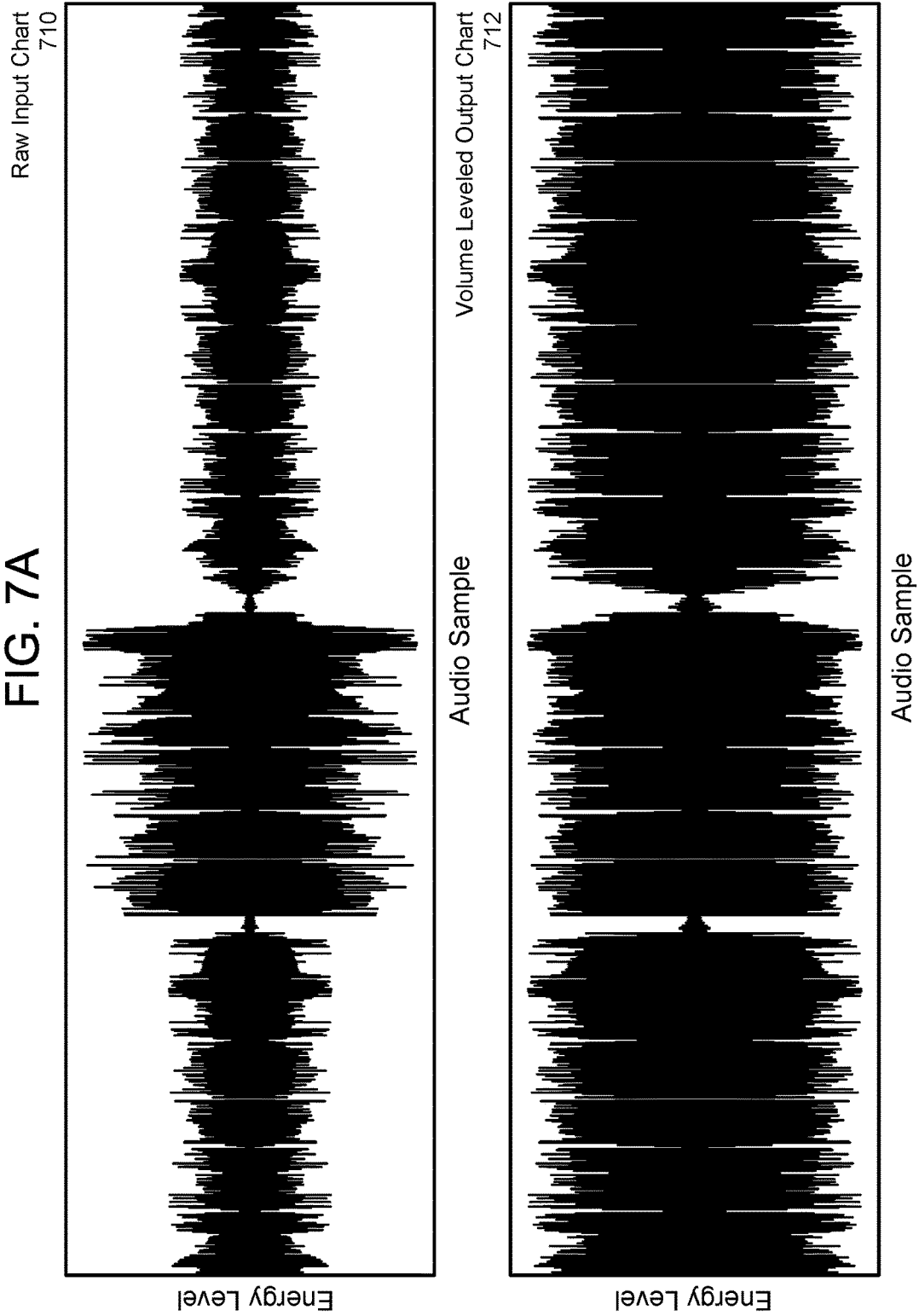

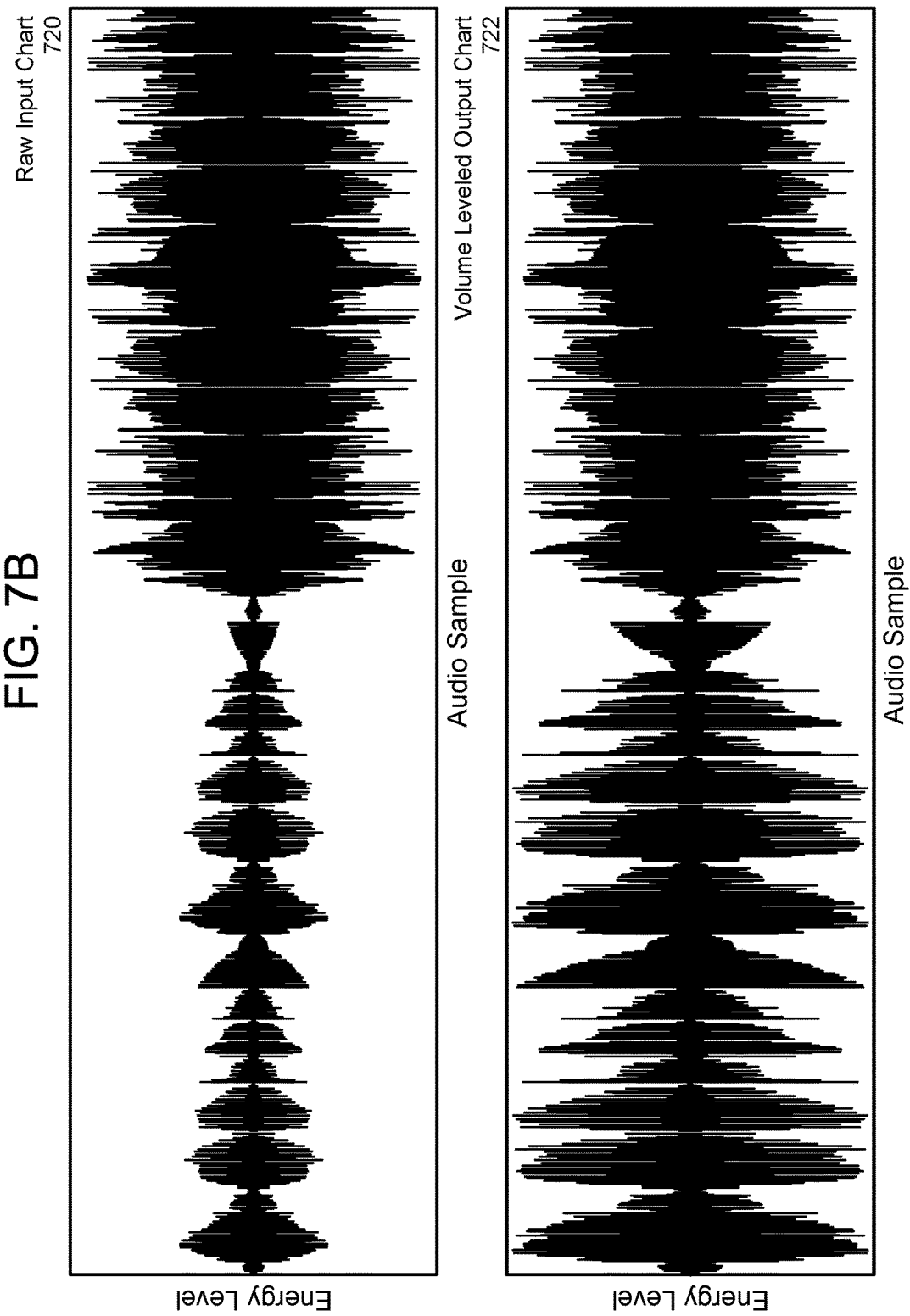

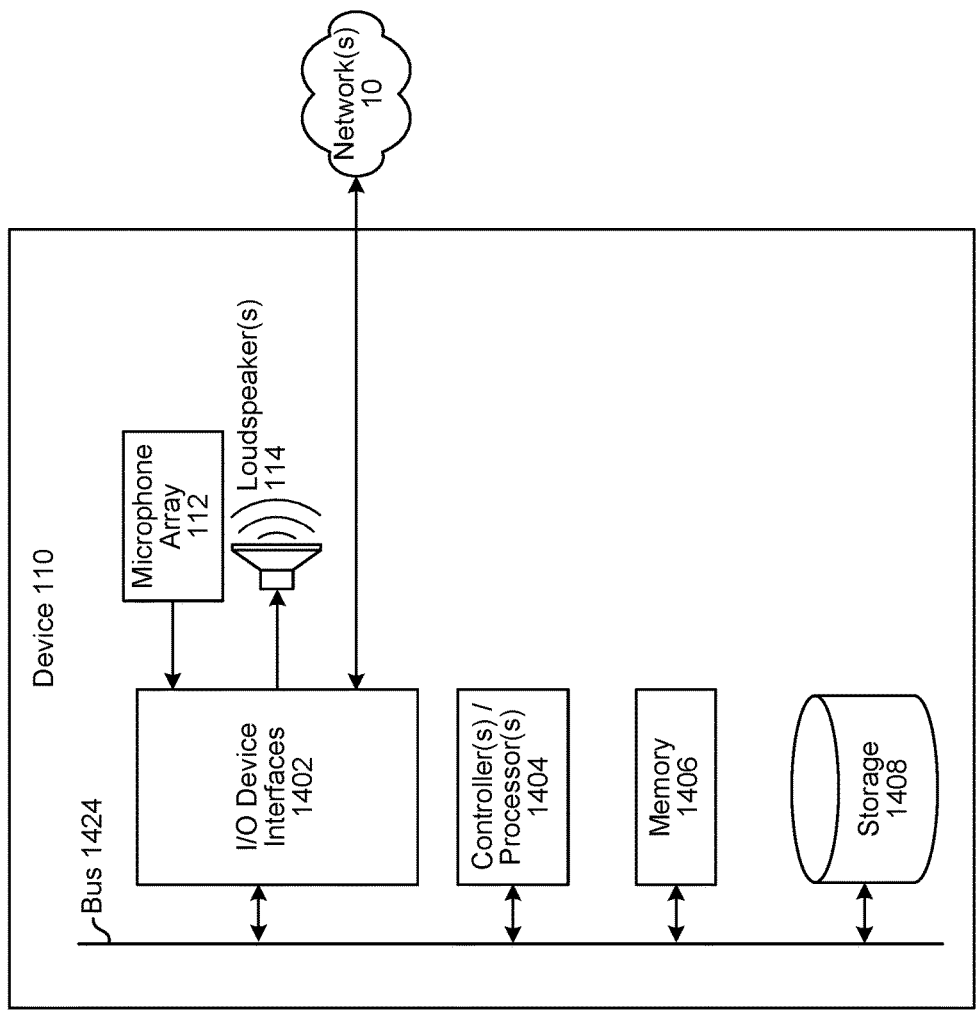

US 10,466,959 B1

AUTOMATIC VOLUME LEVELER

BACKGROUND

With the advancement of technology, the use and popularity of electronic devices has increased considerably. Electronic devices are commonly used to receive audio data and generate output audio based on the received audio data. Described herein are technological improvements to such systems, among other things.

BRIEF DESCRIPTION OF DRAWINGS

For a more complete understanding of the present disclosure, reference is now made to the following description taken in conjunction with the accompanying drawings.

FIG. 1 illustrates a system for performing automatic volume leveling based on audio categories according to embodiments of the present disclosure.

FIG. 2 illustrates an example of an output chart and a corresponding gain chart that illustrate dynamic range compression.

FIG. 5 illustrates an example component diagram for determining a loudness estimate according to embodiments of the present disclosure.

FIGS. 7A-7B illustrate examples of volume-leveled output data according to embodiments of the present disclosure.

FIG. 14 is a block diagram conceptually illustrating example components of a system according to embodiments of the present disclosure.

DETAILED DESCRIPTION

Figure 3:
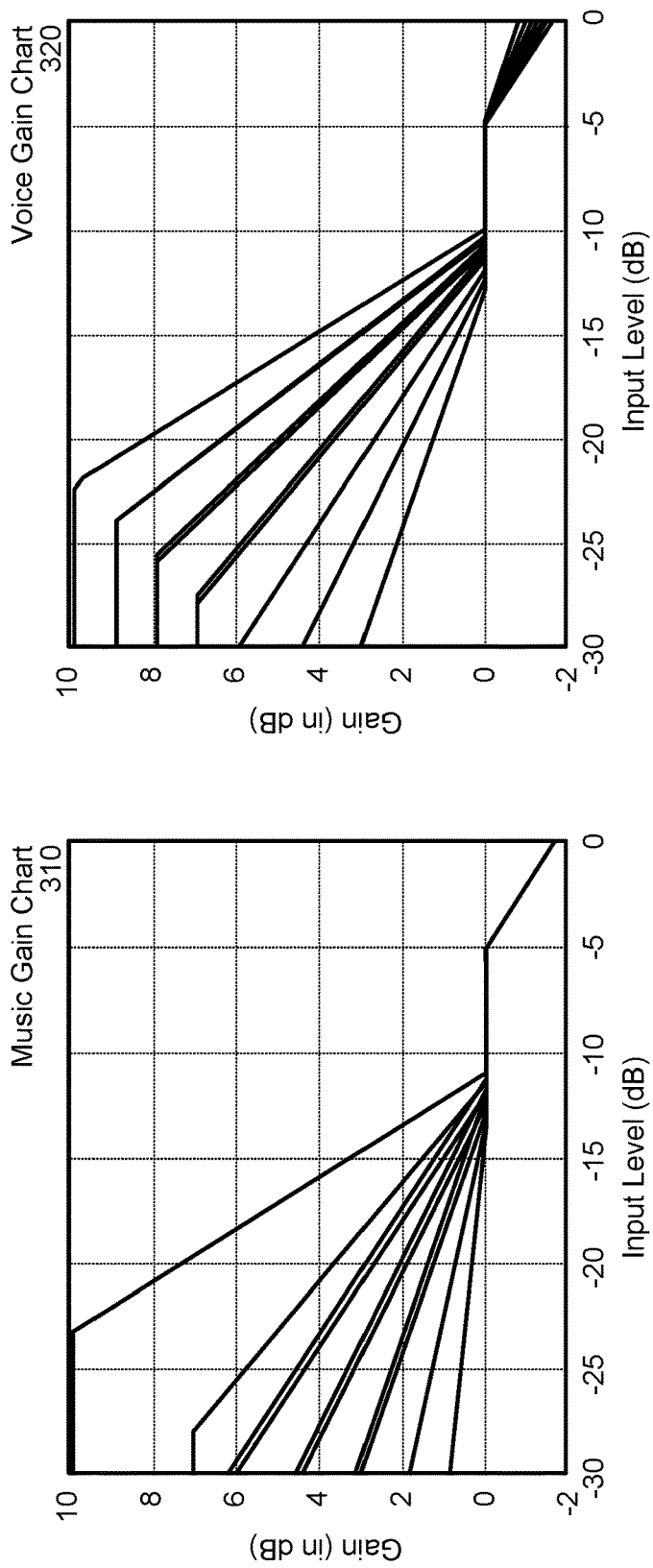
FIG. 3 illustrates example gain charts for different audio categories according to embodiments of the present disclosure.

Electronic devices may be used to receive audio data and generate audio corresponding to the audio data. For example, an electronic device may receive audio data from various audio sources (e.g., content providers) and may generate the audio using loudspeakers. The audio data may have large level changes (e.g., large changes in volume) within a song, from one song to another song, between different voices during a conversation, from one content provider to another content provider, and/or the like. For example, a first portion of the audio data may correspond to music and may have a high volume level (e.g., extremely loud volume), whereas a second portion of the audio data may correspond to a talk radio station and may have a second volume level (e.g., quiet volume).

However, a listener may prefer a consistent and balanced loudness experience (e.g., audio at a consistent volume level) regardless of the level changes that occur in the audio data. Some devices maintain a consistent volume level between different types of audio data by performing automatic volume leveling (AVL) to boost the audio data to a desired volume level. For example, AVL may modify the audio data so that both the first portion and the second portion have a desired volume level. Thus, output audio will maintain a consistent volume level when transitioning between the first portion and the second portion.

While AVL maintains a consistent volume level, conventional techniques may modify the audio data using a similar process for both the first portion and the second portion. Thus, the first portion (e.g., music signals) is volume-leveled using a similar gain curve as the second portion (e.g., voice signals). While performing AVL improves a user experience by removing sudden changes in volume level within the output audio, applying the same process to dissimilar sources of audio may degrade the user experience and/or cause distortion. For example, applying a gradual gain curve may improve a dynamic range for the music signals, but may not be optimal for the voice signals as a higher volume level may be beneficial in hearing and/or understanding speech represented in the voice signals. However, a steeper gain curve may increase the volume level for the voice signals to enable a user to better hear and/or understand the speech represented in the voice signals, but may reduce the dynamic range and/or cause distortion for the music signals.

To improve a user experience and sound quality of output audio, devices, systems and methods are disclosed that perform automatic volume leveling (AVL) using different gain curves for audio data from different audio sources (e.g., different content providers), audio categories (e.g., different types of audio data, such as music, voice, etc.), genres (e.g., musical genres), or the like. For example, the system may distinguish between music signals and voice signals (e.g., speech) and may apply a first gain curve for the music and a second gain curve for the speech. Additionally or alternatively, the system may distinguish between different genres of music and may apply different gain curves based on the genre. Further, the system may select a gain curve based on a desired volume level. Therefore, output audio data generated by performing AVL may be optimized based on the audio category, audio source, genre, desired volume level, and/or the like.

FIG. 1 illustrates a system for performing automatic volume leveling based on audio categories according to embodiments of the present disclosure. As illustrated in FIG. 1, a system 100 may include a device 110 and/or server(s) 120 that may communicate via network(s) 10. While FIG. 1 illustrates the device 110 being a speech controlled device, the disclosure is not limited thereto and the system 100 may include any smart device capable of connecting to a wireless network. As illustrated in FIG. 1, the device 110 may include a microphone array 112 and one or more loudspeaker(s) 114.

The device 110 may be configured to receive input audio data from the server(s) 120 and, using the input audio data, may generate output audio 24 for a user 5. For example, the server(s) 120 may send input audio data corresponding to music, text-to-speech (TTS) (e.g., TTS source(s)), news (e.g., radio broadcasts, flash briefings, daily briefings, etc.), streaming radio broadcasts (e.g., streaming radio source(s), talk radio station(s), music station(s), etc.), Voice-over-Internet Protocol (VoIP) communication sessions, or the like.

The input audio data may have large volume level changes within a single song, between a first song and a second song, between a normal broadcast and advertisements, between a first content provider (e.g., first audio source) to a second content provider (e.g., second audio source), or the like. However, a listener (e.g., the user 5) may prefer a consistent and balanced loudness experience (e.g., consistent volume level) regardless of the level changes that occur in the audio material.

To improve a user experience and maintain a consistent volume level between different portions of the input audio data, the device 110 may perform automatic volume leveling (AVL) to boost or attenuate the input audio data to a desired volume level. For example, a first portion of the input audio data may correspond to music and may have a first energy level (e.g., first volume level), whereas a second portion of the input audio data may correspond to a talk radio station and may have a second energy level (e.g., second volume level) that is very different from the first energy level. If the device 110 generated the output audio 24 without performing AVL to modify the input audio data, the first portion may be extremely loud and the second portion may be quiet, or vice versa. Instead, the device 110 may perform AVL to modify the input audio data so that both the first portion and the second portion have a third volume level (e.g., desired volume level). Thus, the output audio 24 will maintain a consistent volume level when transitioning between the first portion and the second portion.

While AVL maintains a consistent volume level, conventional techniques may modify the input audio data using a similar process for both the first portion and the second portion. Thus, the first portion (e.g., music signals) is volume-leveled using a similar gain curve as the second portion (e.g., voice signals). While performing AVL improves a user experience by removing sudden changes in volume level between different sources of audio data, applying the same process to dissimilar sources of audio may degrade the user experience and/or cause distortion. For example, applying a gradual gain curve (e.g., applying a static level curve that has linear gain based on an input energy level) may improve a dynamic range for the music signals, but may not be optimal for the voice signals as a higher volume level may be beneficial in hearing and/or understanding speech represented in the voice signals. However, a steeper gain curve (e.g., applying a static level curve that has a larger slope and exhibits gain compression) may increase the volume level for the voice signals to enable the user 5 to better hear and/or understand the speech represented in the voice signals, but may reduce the dynamic range and/or cause distortion for the music signals.

To improve a user experience, the device 110 may perform AVL using different gain curves for audio data from different audio sources (e.g., different content providers), audio categories (e.g., different types of audio data, such as music, voice, etc.), genres (e.g., musical genres), or the like. For example, the device 110 may distinguish between music and voice (e.g., speech) and may apply a first gain curve for the music and a second gain curve for the speech. Additionally or alternatively, the device 110 may distinguish between different genres of music and may apply different gain curves based on the genre and/or may apply different equalizer settings based on the genre. Therefore, the output audio data generated by performing AVL may be optimized based on the audio category, audio source, genre, or the like and improve the user experience.

In addition to selecting different gain curves based on audio source, audio category, genre, or the like, the device 110 may also select different gain curves based on a desired volume level (e.g., volume scale) input by the user 5. For example, if the user 5 controls the device 110 to select a first desired volume level (e.g., volume level 4 on a scale of 1-10), the device 110 may select a first gain curve and perform AVL to generate the output audio data using the first gain curve. However, if the user 5 controls the device 110 to select a second desired volume level (e.g., volume level 8 on a scale of 1-10), the device 110 may select a second gain curve and perform AVL to generate the output audio data using the second gain curve. To illustrate an example, the first gain curve may correspond to a quiet volume level and may have a gradual slope with reduced distortion, whereas the second gain curve may correspond to a loud volume level and have a steep slope with gain compression.

As used herein, an input energy level corresponds to a value of the input audio data at a particular point in time (e.g., sound level). Thus, the input energy level may correspond to air pressure (e.g., sound pressure), displacement, power, voltage, intensity, amplitude, and/or the like and is associated with different volume levels of the output audio (e.g., larger energy level corresponds to a higher volume level). Energy levels may be illustrated using decibels (dB), although the disclosure is not limited thereto and energy levels may be measured using any technique known to one of skill in the art.

As used herein, a desired volume level may be input to the device 110 as a volume index value. For example, the volume index value may be an integer between 1 and 10, with a higher volume index value corresponding to higher gain values and therefore larger output energy levels, as described in greater detail below. The volume index value may be input to the device 110 directly by the user 5 (e.g., using touch inputs, voice commands, and/or other input techniques), indirectly by the user 5 directly from a second device (e.g., user 5 inputs the volume index value to the second device and the second device sends the volume index value to the device 110) indirectly by the user 5 via the server(s) 120 (e.g., user 5 inputs the volume index value to the second device, the second device sends the volume index value to the server(s) 120, and the server(s) 120 sends the volume index value to the device 110), based on user preferences and/or historical data (e.g., the device 110 identifies a previously stored volume index value, the server(s) 120 determine the volume index value and send the volume index value to the device 110, etc.), and/or the like. Thus, the user 5 may select the volume index value using voice commands, physical input, external remote controls, secondary devices, and/or the like without departing from the disclosure.

A gain value is an amount of gain (e.g., amplification or attenuation) to apply to the input energy level to generate an output energy level. For example, the device 110 may apply the gain value to the input audio data to generate output audio data. A positive dB gain value corresponds to amplification (e.g., increasing a power or amplitude of the output audio data relative to the input audio data), whereas a negative dB gain value corresponds to attenuation (decreasing a power or amplitude of the output audio data relative to the input audio data). For example, a gain value of 6 dB corresponds to the output energy level being twice as large as the input energy level, whereas a gain value of −6 dB corresponds to the output energy level being half as large as the input energy level.

As used herein, automatic volume leveling (AVL) corresponds to controlling an output energy level for varying input energy levels. For example, the device 110 may measure an average amplitude of the input energy levels associated with a first time range of the input audio data and may dynamically adjust the input-to-output gain to a suitable value to generate output audio data at a desired output energy level (e.g., desired output average amplitude). The average amplitude can be a simple measurement of average power, such as a root mean square (RMS) value that is defined as a square root of mean square (e.g., arithmetic mean of squares of a set of numbers), which may also be referred to as a quadratic mean. Thus, AVL may be correspond to loudness normalization, variable-gain amplification, automatic gain control (AGC), and/or automatic volume control (AVC). Performing AVL results in dynamic range compression, as AVL reduces the volume of loud sounds and amplifies quiet sounds, thus reducing or compressing the dynamic range of the output audio data relative to the input audio data.

FIG. 2 illustrates an example of an output chart and a corresponding gain chart that illustrate dynamic range compression. Output chart 210 illustrates a relationship between input levels and output levels, measured in dB, with input levels along the horizontal axis (e.g., x-coordinates) and output levels along the vertical axis (e.g., y-coordinates). Similarly, gain chart 220 illustrates a relationship between input levels and gain values, measured in dB, with input levels along the horizontal axis (e.g., x-coordinates) and gain values along the vertical axis (e.g., y-coordinates).

The output chart 210 represents a first output curve (e.g., gray line) that corresponds to a first gain curve (e.g., gray line) represented in the gain chart 220. As illustrated in FIG. 2, the first gain curve corresponds to a uniform gain value (e.g., 0 dB) that is constant regardless of input level (e.g., slope of zero) and therefore does not exhibit dynamic range compression. Thus, the first output curve has a slope value of one (e.g., gain value of 0 dB), which corresponds to a 1:1 ratio of the input level to the output level, such that a first input level of −30 dB corresponds to a first output level of −30 dB and a second input level of 0 dB corresponds to a second output level of 0 dB.

In contrast to the first gain curve, AVL determines gain values dynamically based on the input level, increasing the gain at lower input levels (e.g., amplifying quiet sounds) and decreasing the gain at higher energy levels (e.g., attenuating loud sounds). An example of this is illustrated in FIG. 2 as a second gain curve represented by the solid black line in the gain chart 220. As illustrated in FIG. 2, the second gain curve which has a first slope value (e.g., first negative slope) from −30 dB to a first threshold value (e.g., −12 dB), a second slope value (e.g., slope of zero) from the first threshold value to a second threshold value (e.g., −5 dB), and a third slope value (e.g., second negative slope) from −5 dB onward. Thus, the second gain curve exhibits upward compression (e.g., expansion) to increase the loudness of sounds below the first threshold value and downward compression to decrease the loudness of sounds above the second threshold value. An example output generated based on the second gain curve is illustrated in FIG. 2 as a second output curve represented by the solid black line in the output chart 210. As illustrated in FIG. 2, a first input level of −30 dB corresponds to a first output level of −24 dB (e.g., gain of 6 dB), a second input level of −10 dB corresponds to a second output level of −10 dB (e.g., gain of 0 dB), and a third input level of 0 dB corresponds to a third output level of −2 dB (e.g., attenuation of 2 dB).

The device 110 may select different gain curves based on an audio category associated with the input audio data. In some examples, the device 110 may distinguish between two audio categories, such as music and voice, selecting between a first plurality of gain curves and a second plurality of gain curves. For example, the device 110 may select the first plurality of gain curves for first input audio data associated with a first audio category (e.g., music) and may select the second plurality of gain curves for second input audio data associated with a second audio category (e.g., voice). In this example, the first plurality of gain curves would have gradual slopes and exhibit less dynamic range compression to retain the dynamic range of the music represented in the first input audio data, whereas the second plurality of gain curves would have steeper slopes and exhibit more dynamic range compression to amplify quiet sounds at the cost of dynamic range of the second input audio data.

FIG. 3 illustrates example gain charts for different audio categories according to embodiments of the present disclosure. As illustrated in FIG. 3, music gain chart 310 includes a first plurality of gain curves (e.g., multiple static gain curves) corresponding to different volume index values for the first input audio data that is associated with music signals. For example, a minimum volume index value (e.g., volume level 1) may correspond to the lowest gain curve and a maximum volume index value (e.g., volume level 10) may correspond to the highest gain curve. Similarly, voice gain chart 320 includes a second plurality of gain curves corresponding to different volume index values for the second input audio data associated with voice signals.

As illustrated in FIG. 3, the first plurality of gain curves represented in the music gain chart 310 have lower gain values overall and more gradual slopes at different volume index values, which retains the dynamic range of the music signals. In addition, gain compression (e.g., nonlinear slope) occurs only for the top two volume index values (e.g., volume levels 9-10) in the music gain chart 310. Thus, the first plurality of gain curves represented in the music gain chard 310 correspond to less dynamic range compression than the second plurality of gain curves represented in the voice gain chart 320.

In contrast, the second plurality of gain curves represented in the voice gain chart 320 have higher gain values overall and steeper slopes at corresponding volume index values, resulting in more volume index values exhibiting gain compression (e.g., volume levels 4-10) and more aggressive dynamic range compression overall. The second plurality of gain curves result in more loudness normalization (e.g., quieter sounds are amplified more) and higher volume levels for the voice signals relative to the music signals, as consistent volume levels are prioritized at the cost of dynamic range. Thus, the second plurality of gain curves result in less variation in volume levels between different voices (e.g., different users speaking) and/or between words or sentences.

The gain curves illustrated in FIG. 3 are intended only as examples of different gain curves selected by the device 110 and the disclosure is not limited thereto. In addition, while FIG. 3 only illustrates selecting between two different audio categories (e.g., first plurality of gain curves for a first audio category and second plurality of gain curves for a second audio category), the disclosure is not limited thereto and the device 110 may select from a plurality of audio categories based on different feature data, indicators, and/or the like.

In some examples, the device 110 may not only distinguish between voice and music, but may also distinguish between different genres of music or the like. For example, the device 110 may select a different plurality of gain curves for each genre of music without departing from the disclosure. In some examples, the device 110 may apply different equalization settings based on the genre. Thus, the device 110 may generate two different indicators, a first indicator indicating the audio category and a second indicator indicating the genre or other subcategory. Additionally or alternatively, the device 110 may identify one or more additional audio categories associated with alarms, timers, notifications, and/or the like without departing from the disclosure. For example, the device 110 may determine that the input audio data corresponds to an alarm and may select a gain curve associated with the alarm.

While the examples described above refer to selecting different gain curves based on the audio category, the disclosure is not limited thereto and the device 110 may select different gain curves based on a source of the audio data (e.g., content provider). For example, the device 110 may select from a first plurality of gain curves for first input audio data originating from a first source (e.g., first content provider) and may select from a second plurality of gain curves for second input audio data originating from a second source (e.g., second content provider), even when both the first input audio data and the second input audio data are associated with the same audio category (e.g., music). Thus, the device 110 may select different gain curves for a first internet radio station and a second internet radio station, a first application (e.g., first process running on the device 110) and a second application (e.g., second process running on the device 110), and/or the like, without departing from the disclosure.

For ease of illustration, the following examples will describe the device 110 selecting a plurality of gain curves based on an audio category associated with the input audio data. For example, many of the drawings and corresponding description illustrate the device 110 distinguishing between a first audio category (e.g., music) and a second audio category (e.g., voice). However, as mentioned above, the disclosure is not limited thereto and the device 110 may select a plurality of gain curves based on the audio category, the genre of music, the source of the audio data, and/or the like. Thus, "audio category" may be used as a proxy for any of these classifications and similar techniques may be used regardless of what criteria the device 110 uses to select the plurality of gain curves.

In some examples, the device 110 may select a single gain curve regardless of the volume index value. Thus, the device 110 may apply the same gain values regardless of the volume index value and the output audio data is generated at similar output energy levels (e.g., output volume levels) for all volume index values. Additionally or alternatively, the device 110 may select a single gain value regardless of the volume index value and/or the input energy level. For example, the device 110 may select a gain value of 0 dB for all volume index values and/or input energy levels when the audio category is associated with a specific application or process, such that the output energy level of the output audio data is controlled by the application or process. Thus, an alarm application may control the output energy level for a notification alerting the user 5 of the alarm, regardless of the volume index value selected by the user 5.

In order to perform AVL dynamically based on volume level, audio sources, audio categories, genres, and/or the like, the device 110 may receive a volume index value (e.g., desired volume level), may determine an audio category associated with the input audio data, and may select a gain curve based on the volume index value and the audio category. For example, the device 110 may determine a first plurality of gain curves corresponding to a first audio category (e.g., music) and select a first gain curve from the first plurality of gain curves based on a first volume index value (e.g., volume level 4). To generate the output audio data, the device 110 may determine a first input energy level associated with a first time range of the input audio data, may determine a first gain value based on the first gain curve and the first input energy level, and may apply the first gain value to generate a first time range of the output audio data. If the energy level associated with the input audio data changes, the device 110 may determine a second input energy level associated with a second time range of the input audio data, may determine a second gain value based on the first gain curve and the second input energy level, and may apply the second gain value to generate a second time range of the output audio data.

Similarly, if the user 5 inputs a second volume index value (e.g., volume level 8) during the second time range of the input audio data, the device 110 may select a second gain curve from the first plurality of gain curves based on the second volume index value. Using the second gain curve, the device 110 may determine a third gain value based on the second gain curve and the second input energy level and may apply the third gain value to generate the second time range of the output audio data.

If the device 110 determines that a third time range of the input audio data corresponds to a second audio category (e.g., voice), the device 110 may determine a second plurality of gain curves based on the second audio category and select a third gain curve from the second plurality of gain curves based on the second volume index value. The device 110 may determine a third input energy level associated with the third time range of the input audio data, may determine a fourth gain value based on the third gain curve and the third input energy level, and may apply the fourth gain value to generate a third time range of the output audio data.

As illustrated in FIG. 1, the device 110 may receive (130) input audio data and receive (132) a volume index value. For example, the volume index value may be an integer between 1 and 10, with a higher volume index value corresponding to higher gain values and therefore larger output energy levels, as described in greater detail below. As discussed above, the volume index value may be input to the device 110 directly by the user 5 (e.g., using touch inputs, voice commands, and/or other input techniques), indirectly by the user 5 from a second device (e.g., user 5 inputs the volume index value to the second device and the second device sends the volume index value to the device 110) indirectly by the user 5 via the server(s) 120 (e.g., user 5 inputs the volume index value to the second device, the second device sends the volume index value to the server(s) 120, and the server(s) 120 sends the volume index value to the device 110), based on user preferences and/or historical data (e.g., the device 110 identifies a previously stored volume index value, the server(s) 120 determine the volume index value and send the volume index value to the device 110, etc.), and/or the like.

The device 110 may extract (134) feature data from the input audio data and may determine (136) an audio category based on the feature data. These steps will be described in greater detail below with regard to FIG. 4A.

The device 110 may select (138) a static gain curve corresponding to the audio category and the volume index value. For example, the device 110 may determine a first plurality of gain curves corresponding to a first audio category (e.g., music) and select a first gain curve from the first plurality of gain curves based on a first volume index value (e.g., volume level 4).

The device 110 may determine (140) a loudness estimate value associated with the input audio data and may determine (142) a gain value based on the loudness estimate value and the first gain curve. For example, the device 110 may select the gain value in the first gain curve that corresponds to the loudness estimate value. The device 110 may then generate (144) output audio data using the gain value and the input audio data.

The device 110 may continue to perform the steps illustrated in FIG. 1 to generate the first output audio data. For example, as the input energy levels of the input audio data change, the device 110 may determine a current loudness estimate value and update the gain value with a new gain value that corresponds to the current loudness estimate value. If the device 110 receives an indication of a change in the volume index value, the device 110 may determine a current volume index value and update the gain value with a new gain value using the current loudness estimate value and a new gain curve corresponding to the current volume index value. Finally, if the audio category changes (e.g., input audio data changes from music signals to voice signals, or from a first audio source to a second audio source, etc.), the device 110 may determine a current audio category and may update the gain value with a new gain value using the current loudness estimate value and a new gain curve corresponding to the current volume index value and the current audio category.

Figure 4A:
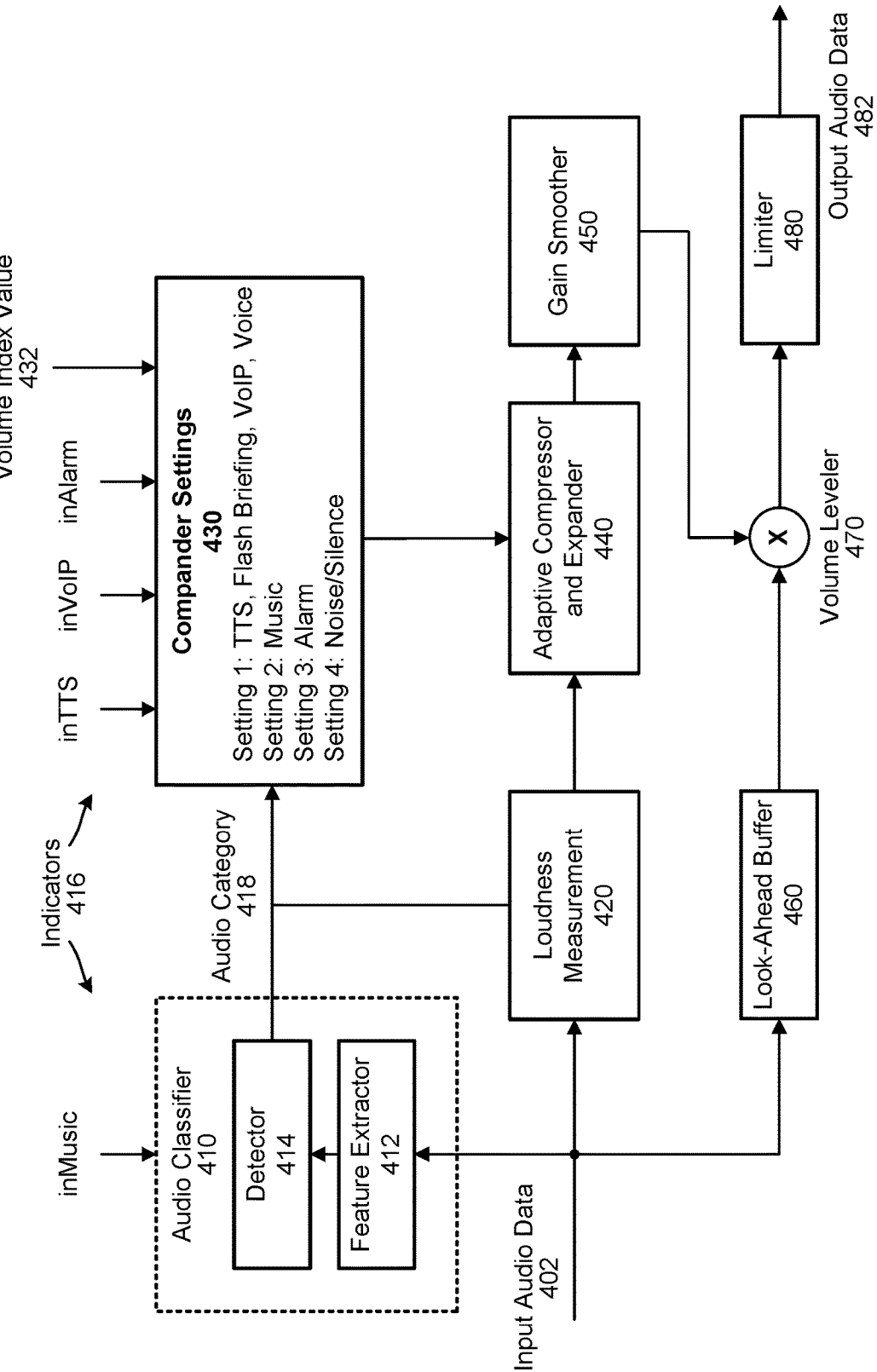
FIGS. 4A-4B illustrate example component diagrams for performing automatic volume leveling according to embodiments of the present disclosure.
Figure 4B:
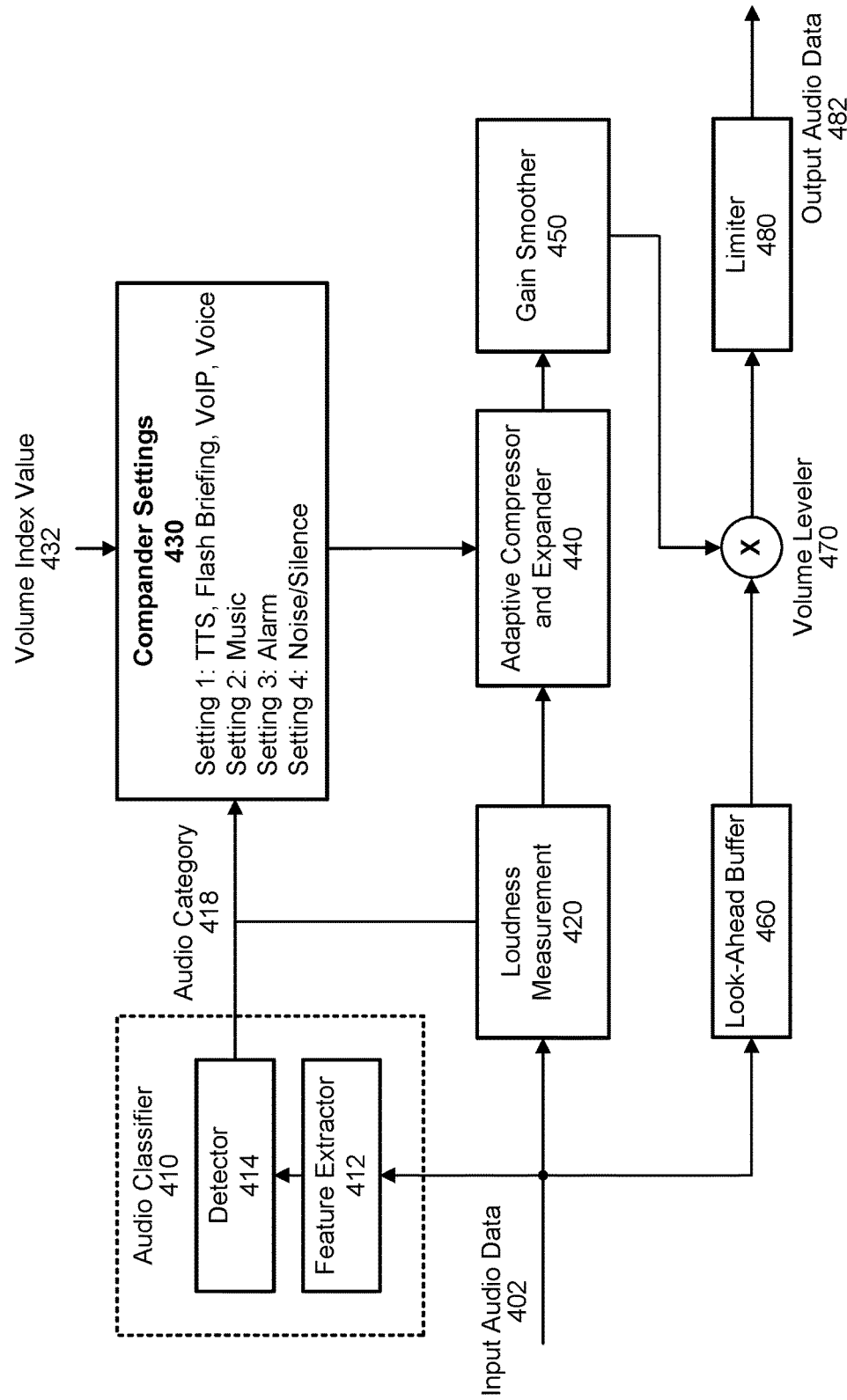

FIGS. 4A-4B illustrate example component diagrams for performing automatic volume leveling according to embodiments of the present disclosure. As illustrated in FIG. 4A, the device 110 may determine an audio category based on indicators and/or feature data extracted from the input audio data. For example, the device 110 may receive input audio data 402 and indicators 416 and may determine an audio category 418 associated with the input audio data 402.

To determine the audio category 418, the device 110 may include an audio classifier 410 that includes a feature extractor 412 and a detector 414. The feature extractor 412 may determine feature data associated with the input audio data 402, as will be described in greater detail below, and may pass the feature data to the detector 414 to classify the input audio data into different audio categories.

To illustrate an example, the feature extractor 412 may determine a first energy level value for all frequency bands of the input audio data 402 (e.g., full-band energy level value), may determine a second energy level value for a first frequency band (e.g., 300 Hz to 3 kHz) of the input audio data, and may determine a third energy level value for a second frequency band (e.g., 8 kHz to 16 kHz) of the input audio data. The feature extractor 412 may determine a first energy level ratio between the first frequency band and the full-band (e.g., ratio between the second energy level value and the first energy level value) and may determine a second energy level ratio between the second frequency band and the full-band (e.g., ratio between the third energy level value and the first energy level value). The first energy level value (e.g., full-band energy of the input audio data) may be a first portion of the feature data that is used to differentiate between silence and music/voice signals, whereas the first energy level ratio and the second energy level ratio may be a second portion of the feature data that is used to differentiate between voice signals and music signals.

The feature extractor 412 may determine an upper envelope value of the input audio data (e.g., upper audio energy envelope value) and may determine a lower envelope value (e.g., floor) of the input audio data (e.g., lower audio energy envelope value) and may determine an envelope ratio value (e.g., ratio between the upper envelope value and the lower envelope value). For example, the upper envelope value corresponds to maximum values of the input audio data 402 (e.g., smooth curve outlining upper extremes of the input audio data 402), the lower envelope value corresponds to minimum values of the input audio data 402 (e.g., smooth curve outlining lower extremes of the input audio data 402), and the envelope ratio value indicates an estimate of an amplitude of the input audio data 402. The envelope ratio value may be a third portion of the feature data that is used to differentiate between noise/silence and voice signals.

The feature extractor 412 may estimate a zero-crossing rate (ZCR) value for the input audio data 402 (e.g., rate of sign-changes along the input audio data 402, such as the rate at which the input audio data 402 includes an audio sample value change (e.g., energy value change) from a positive value to a negative value or from a negative value to a positive value). The ZCR value may be a fourth portion of the feature data that is used to differentiate between noise and music/voice signals.

The detector 414 may receive the feature data from the feature extractor 412 and may determine whether the first energy level value is above a first threshold value. For example, the detector 414 may use the first energy level value (e.g., full-band energy of the input audio data) to differentiate between silence and music/voice signals, with the first threshold value corresponding to a value between first energy level values associated with silence and second energy levels associated with the music/voice signals (e.g., first energy level values are lower than second energy level values).

The detector 414 may determine whether the ZCR value is below a second threshold value. For example, the detector 414 may use the ZCR value to differentiate between noise and music/voice signals, with the second threshold value corresponding to a value between first ZCR values associated with music/voice signals and second ZCR values associated with noise (e.g., second ZCR values are higher than first ZCR values).

The detector 414 may determine whether the envelope ratio value is above a third threshold value. For example, the detector 414 may use the envelope ratio to differentiate between noise/silence and voice signals, with the third threshold value corresponding to a value between first envelope ratio values associated with noise/silence and second envelope ratio values associated with voice signals (e.g., second envelope ratio values are higher than first envelope ratio values).

The detector 414 may determine a difference between the first energy level ratio and the second energy level ratio and determine whether the difference is positive. For example, the difference is positive when the first energy level ratio is larger than the second energy level ratio, which corresponds to voice signals, and the difference is negative when the first energy level ratio is smaller than the second energy level ratio, which corresponds to music signals. Thus, the detector 414 may identify voice signals as the lower frequency bands have more energy relative to the full-band signal than music signals, and the detector 414 may identify music signals as the higher frequency bands have more energy relative to the full-band signal than voice signals.

Based on the feature data, the detector 414 may determine an audio category associated with the input audio data 402. For example, the device 110 may identify silence based on the first energy level value, may identify noise based on the ZCR value, may distinguish between silence/noise and voice signals based on the envelope ratio value, and may distinguish between voice signals and music signals based on the first energy level ratio and the second energy level ratio.

While the above examples describe comparing the feature data to threshold values, the disclosure is not limited thereto and the detector 414 may compare the feature data to any reference data, range of values, and/or the like or use any other technique known to one of skill in the art to determine an audio category associated with the input audio data 402. Further, while the examples only illustrate distinguishing between noise/silence, voice signals, and music signals, the disclosure is not limited thereto and the detector 414 may distinguish between genres of music signals or different types of voice signals without departing from the disclosure. Thus, in some examples, the detector 414 may generate a first indicator indicating the audio category and a second indicator indicating the genre or other subcategory, which may be sent to the compander settings 430 or to a different component without departing from the disclosure.

The indicators 416 may include one or more indicators of a source and/or a type of the input audio data 402. For example, FIG. 4A illustrates the indicators 416 including inMusic (e.g., a first indicator of a first audio path that includes music signals, voice signals, and/or noise/silence), inTTS (e.g., a second indicator of a text-to-speech audio path that includes voice signals and/or noise/silence), inVoIP (e.g., a third indicator of a voice-over-internet-protocol (VoIP) audio path that includes voice signals and/or noise/silence), and/or inAlarm (e.g., a fourth indicator of an alarm audio path that includes audio data corresponding to alarm sounds, timer sounds, notifications, etc.). However, the disclosure is not limited thereto, and the indicators 416 may include other examples without departing from the disclosure. For example, the indicators 416 may include inFlashBriefing (e.g., a fifth indicator of an audio path that includes voice signals corresponding to a news report or the like), inTimer (e.g., a sixth indicator specific to timer sounds), inAudioBook (e.g., a seventh indicator indicating voice signals corresponding to an audiobook), and/or the like. Thus, the indicators 416 may include any type of input, any source of input, and/or any other information that is known to the server(s) 120 and may be used by the device 110 to distinguish between different types of speech, music, or other sounds. For example, the indicators 416 may identify a genre of music (e.g., based on a source of the audio data, such as a streaming radio station or the like), style of voice signals (e.g., news report, audiobook, communication session, etc.), or the like without departing from the disclosure.

When inAlarm is true (e.g., first binary value, such as a value of one), the device 110 may select a first audio category corresponding to the alarm audio path and may set a gain value of 0.0 dB, regardless of a volume index value 432 corresponding to the input audio data 402. This passes the audio data corresponding to alarm sounds, timer sounds, notifications, and/or the like without applying any gain. As discussed above, inAlarm may correspond to an alarm audio path that includes audio data corresponding to alarm sounds, timer sounds, notifications, reminders, etc. However, the disclosure is not limited thereto and inAlarm may only corresponds to alarm sounds and additional indicators 416 may be used to indicate the additional sounds (e.g., inTimer indicating timer sounds, inNotification indicating notifications, etc.). In this example, each of these types of input are treated similarly and given a gain value of 0.0 dB, although the disclosure is not limited thereto.

When either inTTS or inVoIP are true, the device 110 may select a second audio category corresponding to voice signals. However, the disclosure is not limited thereto and in some examples the device 110 may distinguish between audio data corresponding to TTS and audio data corresponding to speech originating from a human, as the audio data may benefit from different gain curves. In some examples, the device 110 may receive additional indicators 416 such as inFlashBriefing or inAudioBook that may also correspond to voice signals. The device 110 may distinguish between different types of voice signals (e.g., human speech, TTS, news reports, audio books, communication sessions, etc.) and may apply different gain curves accordingly.

When inMusic is true, the device 110 may extract the feature data and/or analyze the feature data to detect an audio category, as discussed in greater detail above. For example, the device 110 may determine whether the input audio data 402 corresponds to the second audio category (e.g., voice signals), a third audio category (e.g., music signals), or a fourth audio category (e.g., noise/silence). As discussed above, the device 110 may use the feature data to differentiate between two audio categories (e.g., music or voice), three audio categories (e.g., music, voice or noise/silence), and/or a plurality of audio categories (e.g., different genres of music, additional audio categories, etc.) without departing from the disclosure.

While noise/silence is illustrated as an audio category in some examples, the disclosure is not limited thereto. Instead, the device 110 may classify the input audio data 402 into other audio categories (e.g., music or voice) but also identify noise/silence within the input audio data 402 and select a gain value of 0 dB. For example, a portion of the input audio data 402 may be associated with a first audio category (e.g., music), and gain curves associated with the first audio category may be used to determine gain value(s) and perform AVL. However, whenever noise/silence is detected within the portion of the input audio data 402, the device 110 may freeze adaptation of the loudness estimate value and override the selected gain curve to select a gain value of 0 dB. Thus, the device 110 may detect noise/silence and generate a noise/silence indicator that is separate from the audio category 418. This may be beneficial when the indicators are used to determine the audio category 418, as the device 110 may determine the audio category 418 without using the audio classifier 410, but the audio classifier 410 may still be used to detect noise/silence and generate the noise/silence indicator. For example, if a first indicator (e.g., inMusic) is false and a second indicator (e.g., inTTS) is true, the device 110 may determine that the audio category 418 corresponds to voice signals and may select a corresponding gain curve. However, within the input audio data will be moments of silence where speech is not present and the audio classifier 410 may generate the noise/silence indicator to prevent adaptation of the loudness estimate value and override the selected gain curve to select a gain value of 0 dB during these moments of silence.

As discussed above, the audio classifier 410 may output one or more signals. For example, the audio classifier 410 may generate a first indicator (e.g., audio category 418) indicating an audio category associated with the input audio data 402. In some examples, however, the audio classifier 410 may also generate a second indicator (e.g., noise/silence indicator) indicating moments of silence within the input audio data 402. Additionally or alternatively, the audio classifier 410 may also generate a third indicator indicating a subcategory (e.g., genre, type of voice signals, etc.) that may be used by the compander settings 430 to select a gain curve and also sent to an additional component to select equalization settings or the like.

In some examples, when inMusic is false (e.g., second binary value, such as a value of zero) the audio classifier 410 may not extract the feature data and/or detect audio categories in the input audio data 402. However, the disclosure is not limited thereto and in some examples the audio classifier 410 may operate even when inMusic is false. For example, the audio classifier 410 may detect voice signals, music signals, and/or noise/silence in the input audio data 402 to assist and/or confirm the audio category indicated by indicators 416. Thus, the audio classifier 410 may determine that portions of the input audio data 402 correspond to noise/silence even when inMusic is false and inTTS or inVoIP is true without departing from the disclosure.

The audio classifier 410 may pass the audio category 418 to loudness measurement 420 and/or compander settings 430. The loudness measurement determines a loudness estimate value corresponding to the input audio data 402, as discussed in greater detail below with regard to FIG. 5, and passes the loudness measurement estimate to an adaptive compressor and expander 440.

The compander settings 430 identify different settings based on the audio category 418. As illustrated in FIG. 4, these settings may correspond to a first setting (e.g., TTS, flash briefing, VoIP, or other voice signals), a second setting (e.g., music signals), a third setting (e.g., Alarm), a fourth setting (e.g., noise/silence), and/or the like. While FIG. 4A only illustrates these four settings, the disclosure is not limited thereto and the compander settings may associate the audio category 418 with any number of different settings without departing from the disclosure.

The compander settings 430 may receive the audio category 418, may receive a volume index value 432 and may select a static gain curve based on the audio category 418 and the volume index value 432. For example, the device 110 may select a plurality of gain curves corresponding to the audio category 418 and then select a gain curve from the plurality of audio gain curves based on the volume index value 432. Thus, if the volume index value changes, the device 110 may select a different gain curve from the plurality of gain curves that corresponds to the updated volume index value.

The adaptive compressor and expander 440 may receive the selected gain curve from the compander settings 430, may receive the loudness estimate value from the loudness measurement 420, and may determine an instantaneous gain value based on the static gain curve and the loudness estimate value. For example, the adaptive compressor and expander 440 may select the gain value along the static gain curve that corresponds to the loudness estimate value. While FIG. 4A illustrates the compander settings 430 as being separate from the adaptive compressor and expander 440, the disclosure is not limited thereto and the adaptive compressor and expander 440 may include the compander settings 430 without departing from the disclosure.

The adaptive compressor and expander 440 may output the instantaneous gain value to a gain smoother 450, and the gain smoother 450 may generate a smoothed gain value. For example, the gain smoother 450 may determine the smoothed gain value using the equation shown below:

$$g(n)=\alpha*g(n-1)+(1-\alpha)*\text{gain} \quad [1]$$

where the factor $\alpha$ is between 0.0 and 1.0.

Thus, the gain smoother 450 incorporates previous gain values to reduce the variation of the dynamic gain, with an amount of previous gains determined based on the value chosen for the factor $\alpha$. For example, $\alpha=0$ corresponds to only using the instantaneous gain value, $\alpha=1$ corresponds to using a constant gain value, and $0<\alpha<1$ corresponds to a variable amount of smoothing. As a result, the gain smoother 450 ramps between different gain values when the compander settings 430 dynamically switches between different settings for various audio categories and/or volume index values.

A look-ahead buffer 460 may receive the input audio data 402 and generate delayed audio data corresponding to the input audio data 402. For example, the look-ahead buffer 460 introduces a slight delay that allows the device 110 to generate predictive level control, such that the gain decreases before any loud noises or other large variations in volume.

The device 110 may generate volume-leveled audio data by applying the smoothed gain value to the delayed audio data. For example, a volume leveler 470 may receive the delayed input audio data from the look-ahead buffer 460 and may multiply the delayed input audio data by the smoothed gain value. Finally, the device 110 may modify the volume-leveled audio data to avoid clipping using a limiter 480 in order to generate output audio data 482.

While FIG. 4A illustrates a first example in which the device 110 determines an audio category and performs automatic volume leveling using indicators 416, the disclosure is not limited thereto. Instead, FIG. 4B illustrates a second example in which the device 110 may determine the audio category associated with the input audio data 402 and perform automatic volume leveling to generate the output audio data 482 without the indicators 416. Each of the components illustrated in FIG. 4B operate as described above with regard to FIG. 4A, except that the device 110 does not receive the indicators 416 and the audio classifier 410 always extracts the feature data and determines the audio category 418 for the input audio data 402.

FIG. 5 illustrates an example component diagram for determining a loudness estimate according to embodiments of the present disclosure. The loudness measurement 420 may include K2-weighting filter(s) 510, noise/silence detection 520, high pass filter(s) (HPF) 530, RMS level estimate(s) 540, weighting adjustment(s) 550, and/or a combiner 560. As illustrated in FIG. 5, the loudness measurement 420 may determine a loudness estimate value for two or more audio channels. For example, the loudness measurement 420 may receive first audio data corresponding to a first channel of the input audio data (e.g., $x_l(n)$) and second audio data corresponding to a second channel of the input audio data (e.g., $x_r(n)$).

As illustrated in FIG. 5, the K2-weighting filter 510a may receive the first audio data (e.g., $x_l(n)$) and may generate second audio data by filtering the first audio data. For example, the K2-weighting filter 510a may filter the first audio data using a second order infinite impulse response (IIR) filter with a 100 Hz cutoff frequency, although the disclosure is not limited thereto. The K2-weighting filter 510a may output the second audio data to noise/silence detection 520a and to HPF 530a.

The HPF 530a may generate third audio data by filtering the second audio data using a high-pass filter. For example, the HPF 530a may filter the first audio data using a cutoff frequency chosen based on a size of the loudspeaker(s) associated with the device 110, such as a 60 Hz cutoff frequency or a 300 Hz cutoff frequency.

The noise/silence detection 520*a* may determine if noise/silence is detected in the first audio data. For example, the noise/silence detection 520*a* may use the techniques discussed above with regard to the audio classifier 410 to detect noise/silence. If noise/silence is not detected, a RMS level estimate 540*a* may determine a root mean square (RMS) level estimate using the third audio data. For example, the RMS level estimate 540*a* may determine the RMS level estimate in a first time range of the third audio data. If silence/noise was detected by the noise/silence detection 520*a*, the RMS level estimate 540*a* may freeze adaptation of the RMS level estimate and not update the RMS level estimate (e.g., not calculate a current loudness estimate during periods of noise/silence).

The RMS level estimate 540*a* may output the RMS level estimate to a weighting adjustment 550*a*, which may apply a weight value to the RMS level estimate to generate a channel loudness estimate. For example, for the stereo implementation illustrated in FIG. 5, the weight value may correspond to a value of 0.5, whereas for a five channel implementation, the weight value may correspond to a value of 0.2.

The loudness measurement 420 may perform the steps described above to determine a channel loudness estimate for each channel of the input audio data. For example, FIG. 5 illustrates a second channel that includes the same components as described above to generate a second channel loudness estimate. A combiner 560 may combine the first channel loudness estimate 570, which is output to the adaptive compressor and expander 440.

As discussed above, the loudness measurement 420 determine whether noise/silence is detected and, if not (e.g., audio data corresponds to music, voice, and/or other audio categories), may update the loudness estimate 570. For example, the loudness measurement 420 may determine the loudness estimate 570 using the following equation:

$$x^2_{rms}(n) = (1-k) \cdot x^2_{rms}(n-1) + k \cdot [x(n)]^2 \quad [2]$$

where x(n) is the input audio data, factor k=1−exp(−2.2/(fs*t/1000)), t is a time constant in milliseconds (e.g., 50 ms), and fs is the sampling rate (e.g., 48 kHz).

If the loudness measurement 420 has not determined a previous loudness estimate value, the loudness measurement 420 may use determine an initial loudness estimate value. Once the loudness measurement 420 has determined a previous loudness estimate value, the loudness measurement 420 may update or "adapt" the loudness estimate value using Equation [2]. However, when the loudness measurement 420 determines that noise/silence is detected, then adaptation of the loudness estimate value is frozen. For example, the loudness estimate 570 would be determined using the following equation:

$$x^2_{rms}(n) = x^2_{rms}(n-1) \quad [3]$$

Figure 6A:
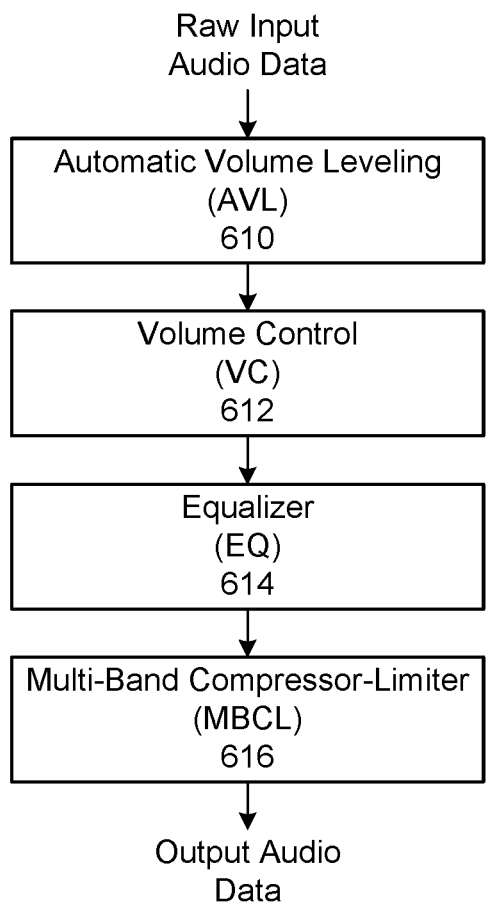
FIGS. 6A-6B illustrate example component diagrams for performing automatic volume leveling in different audio paths according to embodiments of the present disclosure.
Figure 6B:
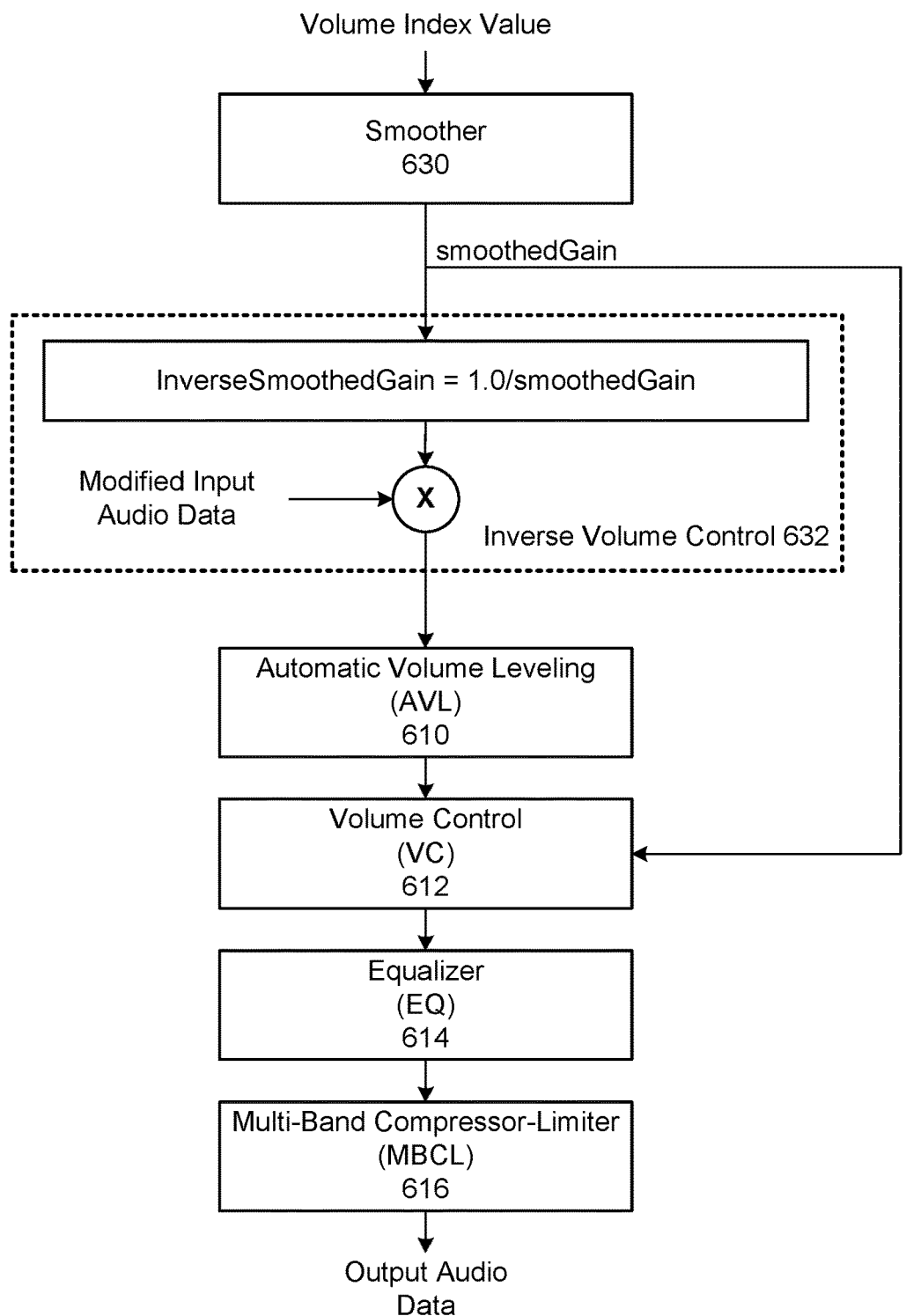

FIGS. 6A-6B illustrate example component diagrams for performing automatic volume leveling in different audio paths according to embodiments of the present disclosure. In some examples, the device 110 may receive raw input audio data prior to any volume control or any other processing that would modify the raw input audio data. FIG. 6A illustrates a first example corresponding to receiving raw input audio data and performing automatic volume leveling (AVL) and other audio processing to generate output audio data. In other examples, however, the device 110 may receive modified input audio data that has already been processed with volume control or other audio processing. FIG. 6B illustrates a second example corresponding to receiving modified input audio data, wherein the device 110 may perform an inverse operation to recover the raw input audio data prior to performing AVL and the other audio processing to generate the output audio data.

As illustrated in FIG. 6A, an automatic volume leveler 610 may receive raw input audio data and perform AVL to generate first audio data, which is output to a volume control (VC) 612. The VC 612 may perform volume control (e.g., embedded volume control) to generate second audio data, which is output to an equalizer (EQ) 614. The EQ 614 may perform equalization (e.g., apply different gain values to different frequency bands of the second audio data) to generate third audio data, which is output to a multi-band compressor-limiter (MBCL) 616. The MBCL 616 may perform multi-band compression/limiting (e.g., compensate for distortion that is unique to one or more loudspeaker(s) associated with the device 110) to generate fourth audio data, which is output as output audio data to be sent to the one or more loudspeaker(s). The one or more loudspeaker(s) may generate output audio based on the output audio data.

The AVL 610 performs audio processing specific for the raw input audio data (or portions of the raw input audio data) based on the audio source, the audio category, the volume index value, and/or the like. Thus, the audio processing performed by the AVL 610 changes dynamically based on the raw input audio data. In contrast, the MBCL 616 performs audio processing specific for the one or more loudspeaker(s) that are associated with the device 110 and used to generate the output audio. Thus, the audio processing performed by the MBCL 616 is static for the device 110.

The audio processing performed by the VC 612 is intended to convert volume levels from a logarithmic scale (e.g., decibels) to a linear scale (e.g., volume value between 0.0-1.0). For example, the VC 612 may correspond to embedded volume control that converts from a logarithmic scale associated with the first audio data to a linear scale associated with the second audio data.

The audio processing performed by the EQ 614 depends on settings and/or user preferences stored by the device 110 and/or applications running on the device 110. For example, equalization settings may be static for the device 110, may be genre-specific (e.g., equalization settings change based on the genre of music identified by the audio classifier 410), may be user-specific (e.g., equalization settings change based on user profile), may be application or process specific (e.g., each process running on the device 110 has different equalization settings), and/or may be controlled by a user interface (e.g., enabling the user 5 to easily change the equalization settings). Thus, in some examples the equalization settings may vary depending on a time of day, a source of audio, an application, a genre of music, and/or the like. To illustrate an example of the equalization settings varying based on genre, the audio classifier 410 may determine that the input audio data 402 corresponds to a first audio category (e.g., music) and further to a first subcategory (e.g., genre of music). The audio classifier 410 may send the first audio category and/or the first subcategory to the compander settings 430 in order to select an appropriate gain curve for the adaptive compressor and expander 440. In addition, the audio classifier 410 and/or the compander settings 430 may send the first subcategory to the EQ 614 in order to select appropriate equalization settings. Thus, the EQ 614 may apply first equalization settings for a first genre of music (e.g., jazz) and second equalization settings for a second genre of music (e.g., rock).

As discussed above, FIG. 6B illustrates a second example corresponding to receiving modified input audio data, wherein the device 110 may perform an inverse operation to recover the raw input audio data prior to performing AVL and the other audio processing to generate the output audio data. As illustrated in FIG. 6B, a smoother 630 may receive a volume index value used to generate the modified input audio data and may determine a smoothed gain (e.g., smoothedGain) based on the volume index value. In some examples, the smoothed gain may be an entire volume curve (e.g., the volume curve corresponding to the volume index value, which was applied by volume control to generate the modified input audio data), although the disclosure is not limited thereto and the smoothed gain may be a single value without departing from the disclosure.

Using the smoothed gain, the device 110 may perform inverse volume control to recover the raw input audio data. For example, inverse volume control 632 determines an inverse smoothed gain based on the smoothed gain (e.g., InverseSmoothedGain=1.0/smoothedGain) and then uses the inverse smooth gain and the modified input audio data to generate raw input audio data. The raw input audio data corresponds to the input audio data prior to volume control being performed.

Then the automatic volume leveler 610 may receive the raw input audio data and perform AVL to generate first audio data, which is output to the volume control (VC) 612. The VC 612 may perform volume control (e.g., embedded volume control) to generate second audio data, which is output to an equalizer (EQ) 614. As illustrated in FIG. 6B, the VC 612 may perform volume control using the smoothed gain determined by the smoother 630.

The EQ 614 may perform equalization (e.g., apply different gain values to different frequency bands of the second audio data) to generate third audio data, which is output to a multi-band compressor-limiter (MBCL) 616. The MBCL 616 may perform multi-band compression/limiting (e.g., compensate for distortion that is unique to one or more loudspeaker(s) associated with the device 110) to generate fourth audio data, which is output as output audio data to be sent to the one or more loudspeaker(s).

FIGS. 7A-7B illustrate examples of volume-leveled output data according to embodiments of the present disclosure. As illustrated in FIG. 7A, a first input chart 710 illustrates an example of first input audio data corresponding to music signals and a first volume leveled output chart 712 illustrates an example of first output audio data generated based on a first gain curve associated with music signals. As represented in the first input chart 710, the first input audio data can be separated into three distinct portions that are associated with different input energy levels; a first portion associated with a first input energy level, a second portion associated with a second input energy level that is higher than the first input energy level, and a third portion associated with a third input energy level that is significantly lower than the second input energy level and appears to be lower than the first input energy level. The device 110 may select the first gain curve based on the first audio category (e.g., music signals) and a current volume index value, may determine first loudness estimate values based on the input energy levels, may determine first gain values corresponding to the first loudness estimate values, and may generate the first output audio data using the first gain values. As represented in the first volume leveled output chart 712, the first output audio data has relatively consistent output energy levels, with each of the three portions of the first input audio data corresponding to a similar volume level in the first output audio data.

As illustrated in FIG. 7B, a second input chart 720 illustrates an example of second input audio data corresponding to voice signals and a second volume leveled output chart 722 illustrates an example of second output audio data generated based on a second gain curve associated with voice signals. As represented in the second input chart 720, the second input audio data can be separated into two distinct portions that are associated with different input energy levels; a first portion that is associated with a first input energy level and a second portion that is associated with a second input energy level that is higher than the first input energy level. The device 110 may select a second gain curve based on the second audio category (e.g., voice signals) and a current volume index value, may determine second loudness estimate values based on the input energy levels, may determine second gain values corresponding to the second loudness estimate values, and may generate the second output audio data using the second gain values. As represented in the second volume leveled output chart 722, the second output audio data has relatively consistent output energy levels, with both portions of the second input audio data corresponding to a similar volume level in the second output audio data.

Figure 8:
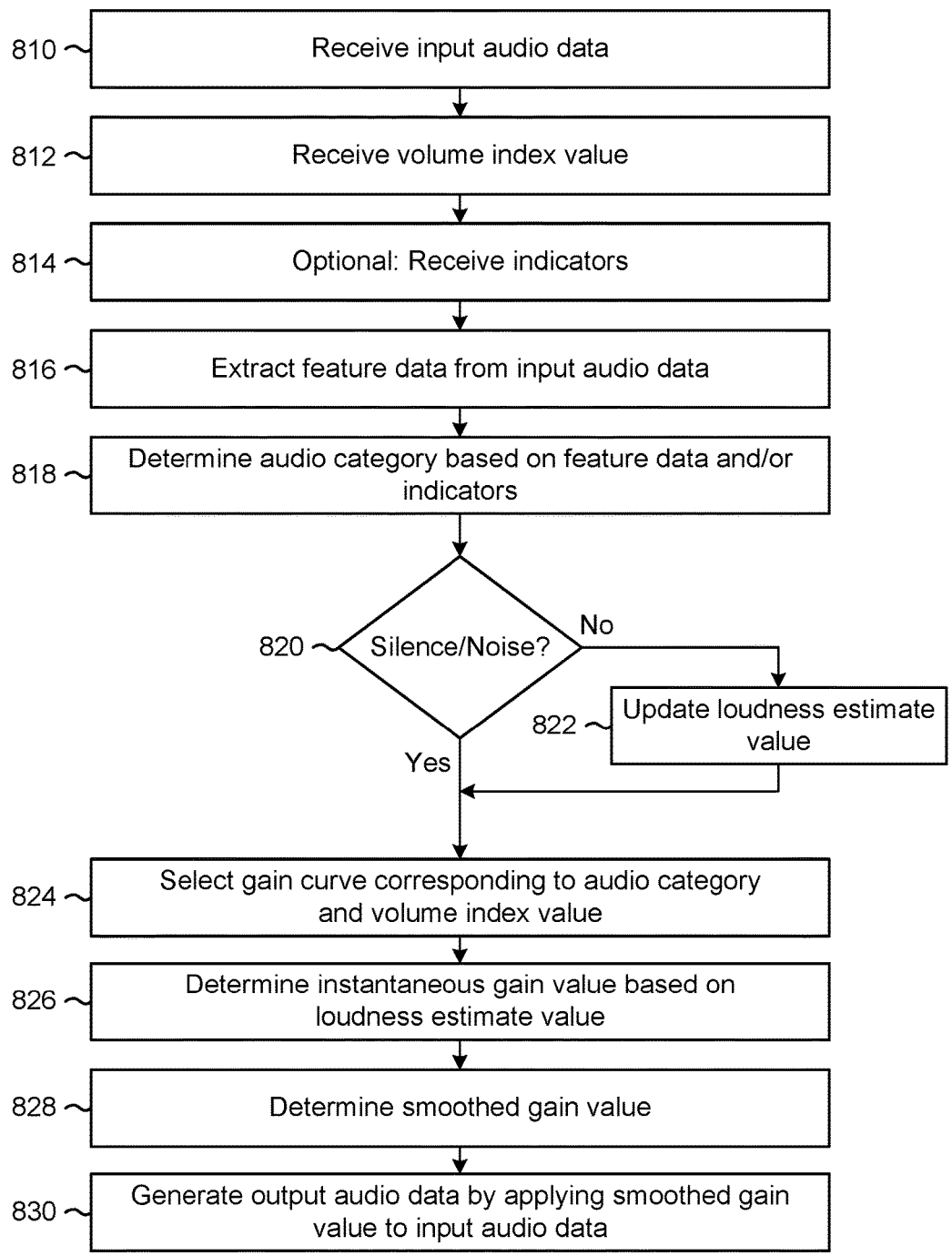
FIG. 8 is a flowchart conceptually illustrating an example method for generating volume-leveled output audio data according to embodiments of the present disclosure.

FIG. 8 is a flowchart conceptually illustrating an example method for generating volume-leveled output audio data according to embodiments of the present disclosure. As illustrated in FIG. 8, the device 110 may receive (810) input audio data, receive (812) a volume index value, and may optionally receive (814) indicators. The device 110 may determine an audio category without the indicators, but if the indicators are available they assist the device 110 in selecting an appropriate audio category and corresponding compander settings.

To determine the audio category, the device 110 may extract (816) feature data from the input audio data and may determine (818) the audio category based on the feature data and/or the indicators, as described in greater detail above with regard to FIGS. 4A-4B. As discussed above, the device 110 may use the feature data to differentiate between two audio categories (e.g., music or voice), three audio categories (e.g., music, voice or noise/silence), and/or a plurality of audio categories (e.g., different genres of music, additional audio categories, etc.) without departing from the disclosure.

While noise/silence is illustrated as an audio category in some examples, the disclosure is not limited thereto. Instead, the device 110 may classify audio data into other audio categories (e.g., music or voice) but also identify noise/silence within the audio data and select a gain value of 0 dB. For example, a portion of audio data may be associated with a first audio category (e.g., music), and gain curves associated with the first audio category may be used to determine gain value(s) and perform AVL. However, whenever noise/silence is detected within the portion of the audio data, the device 110 may freeze adaptation of the loudness estimate value and override the selected gain curve to select a gain value of 0 dB. Thus, the device 110 may detect noise/silence and generate a noise/silence indicator that is separate from the audio category. This may be beneficial when the indicators are used to determine the audio category, as the device 110 may determine the audio category without using the audio classifier 410, but the audio classifier 410 may still be used to detect noise/silence and generate the noise/silence indicator. For example, if a first indicator (e.g., inMusic) is false (e.g., first binary value) and a second indicator (e.g., inTTS) is true (e.g., second binary value), the device 110 may determine that the audio category corresponds to voice signals and may select a corresponding gain curve. However, within the input audio data will be moments of silence where speech is not present and the audio classifier 410 may generate the noise/silence indicator to prevent adaptation of the loudness estimate value and override the selected gain curve to select a gain value of 0 dB during these moments of silence.

The device 110 may determine (820) whether noise/silence is detected and, if not (e.g., audio data corresponds to music, voice, and/or other audio categories), may update (822) a loudness estimate value. For example, the loudness measurement 420 may determine the loudness estimate value for a specified time range, as discussed above with regard to FIG. 5. If the loudness measurement 420 has determined a previous loudness estimate value, the loudness measurement 420 may update or "adapt" the loudness estimate value as discussed above.

After updating the loudness estimate value in step 822, or if silence/noise is detected in step 820, the device 110 may select (824) a gain curve corresponding to the audio category and the volume index value. For example, the device 110 may select a plurality of gain curves based on the audio category and then select the gain curve from the plurality of gain curves based on the volume index value. Thus, if the volume index value changes, the device 110 may select a different gain curve from the plurality of gain curves that corresponds to the updated volume index value.

Based on the selected gain curve, the device 110 may determine (826) an instantaneous gain value using the loudness estimate value. For example, the device 110 may determine the gain value along the gain curve that corresponds to the loudness estimate value, as discussed above with regard to FIG. 3. The device 110 may then determine (828) a smoothed gain value based on the instantaneous gain value, as discussed above with regard to the gain smoother 450 illustrated in FIGS. 4A-4B. For example, the gain smoother 450 incorporates previous gain values to reduce the variation of the dynamic gain, with an amount of previous gains determined based on the value chosen for $\alpha$. Thus, $\alpha=0$ corresponds to only using the instantaneous gain value, $\alpha=1$ corresponds to using a constant gain value, and $0<\alpha<1$ corresponds to a variable amount of smoothing.

The device 110 may generate (830) output audio data by applying the smoothed gain value to the input audio data. For example, the device 110 may receive delayed input audio data from the look-ahead buffer 460 and may multiply delayed input audio data by the smoothed gain value using the volume leveler 470, as illustrated in FIGS. 4A-4B. As part of generating the output audio data, the device 110 may modify the output audio data using the limiter 480 to avoid clipping.

Figure 9:
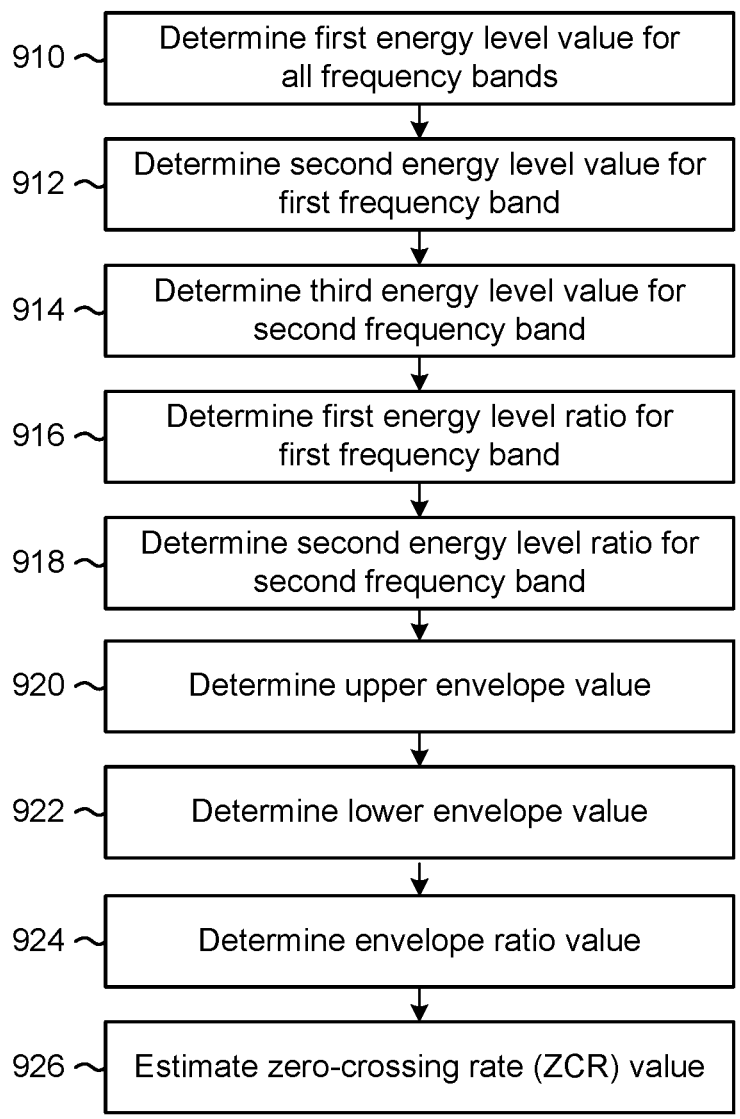
FIG. 9 is a flowchart conceptually illustrating an example method for determining feature data according to embodiments of the present disclosure.

FIG. 9 is a flowchart conceptually illustrating an example method for determining feature data according to embodiments of the present disclosure. As illustrated in FIG. 9, the device 110 may determine (910) a first energy level value for all frequency bands of the input audio data (e.g., full-band energy level value), may determine (912) a second energy level value for a first frequency band (e.g., 300 Hz to 3 kHz) of the input audio data, and may determine (914) a third energy level value for a second frequency band (e.g., 8 kHz to 16 kHz) of the input audio data. The device 110 may determine (916) a first energy level ratio between the first frequency band and the full-band (e.g., ratio between the second energy level value and the first energy level value) and may determine (918) a second energy level ratio between the second frequency band and the full-band (e.g., ratio between the third energy level value and the first energy level value). The first energy level value (e.g., full-band energy of the input audio data) may be used to differentiate between silence and music/voice signals, whereas the first energy level ratio and the second energy level ratio may be used to differentiate between voice signals and music signals.

The device 110 may determine (920) an upper envelope value of the input audio data and may determine (922) a lower envelope value of the input audio data and may determine (924) an envelope ratio value (e.g., ratio between the upper envelope value and the lower envelope value). For example, the upper envelope value corresponds to maximum values of the input audio data (e.g., smooth curve outlining upper extremes of the input audio data), the lower envelope value corresponds to minimum values of the input audio data (e.g., smooth curve outlining lower extremes of the input audio data), and the envelope ratio value indicates an estimate of an amplitude of the input audio data. The envelope ratio value may be used to differentiate between noise/silence and voice signals.

The device 110 may estimate (926) a zero-crossing rate (ZCR) value for the input audio data (e.g., rate of sign-changes along the input audio data, such as the rate at which the input audio data includes an audio sample value change (e.g., energy value change) from a positive value to a negative value or from a negative value to a positive value). The ZCR value may be used to differentiate between noise and music/voice signals.

Figure 10A:
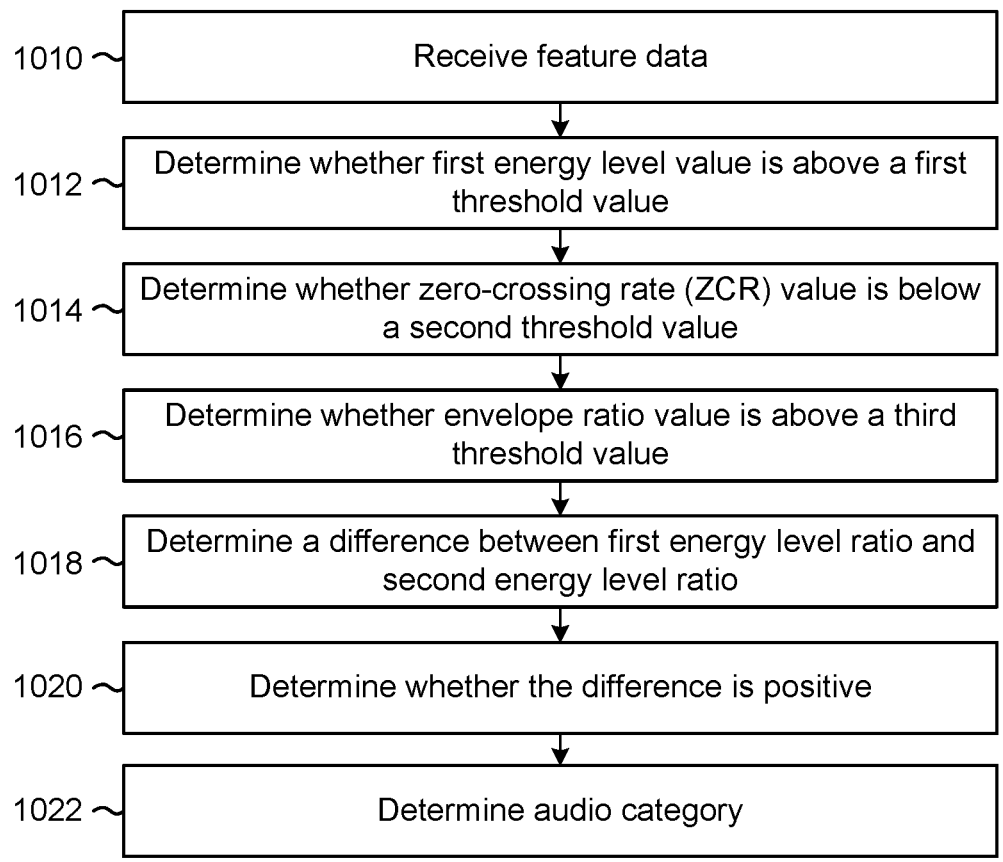
FIGS. 10A-10B are flowcharts conceptually illustrating example methods for determining an audio category according to embodiments of the present disclosure.
Figure 10B:
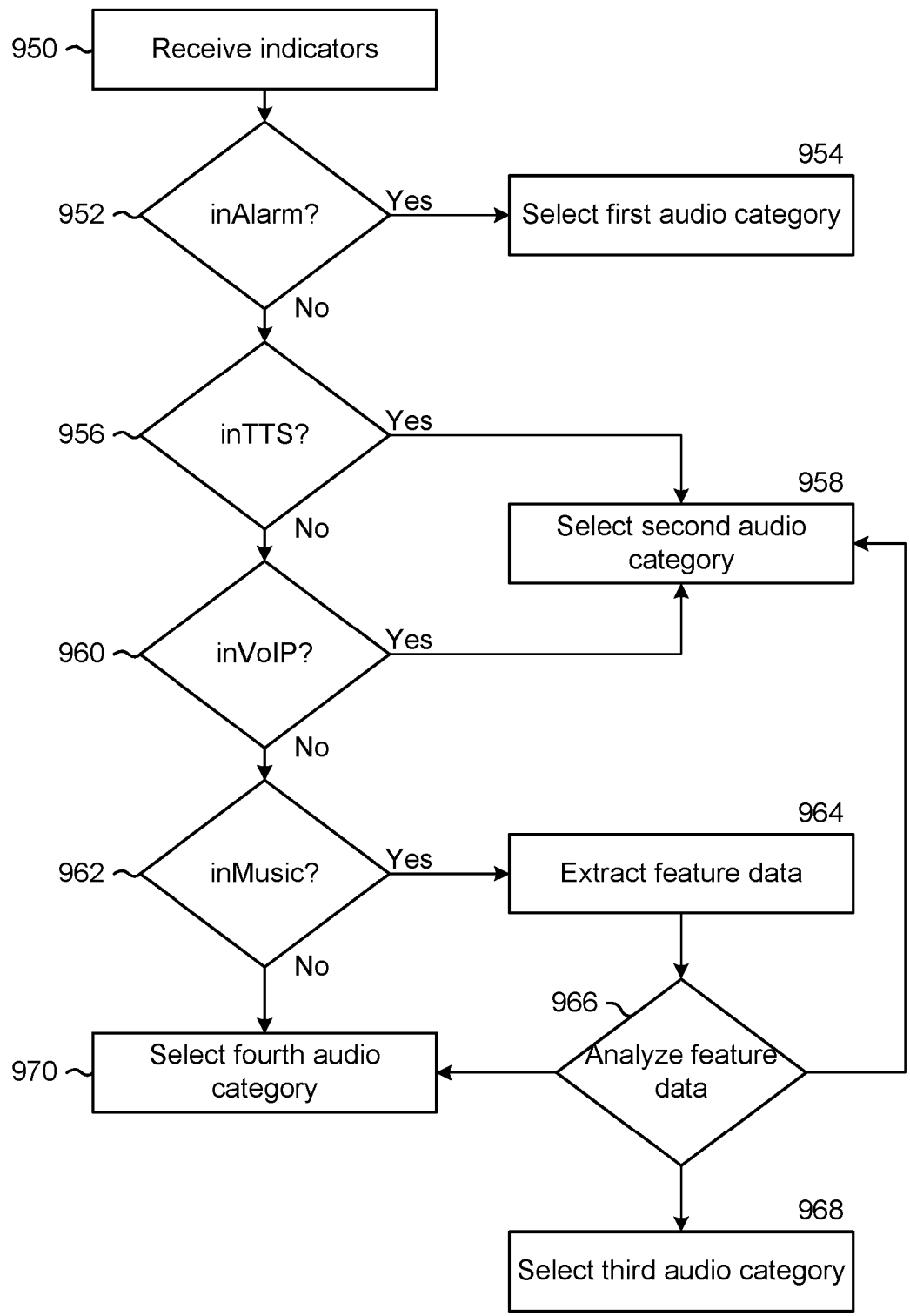

FIGS. 10A-10B are flowcharts conceptually illustrating example methods for determining an audio category according to embodiments of the present disclosure. FIG. 10A illustrates a first example method for performing audio classification to determine the audio category. As illustrated in FIG. 10A, the device 110 may receive (1010) feature data and may determine (1012) whether the first energy level value is above a first threshold value. For example, the device 110 may use the first energy level value (e.g., full-band energy of the input audio data) to differentiate between silence and music/voice signals, with the first threshold value corresponding to a value between first energy level values associated with silence and second energy levels associated with the music/voice signals (e.g., first energy level values are lower than second energy level values).

The device 110 may determine (1014) whether the ZCR value is below a second threshold value. For example, the device 110 may use the ZCR value to differentiate between noise and music/voice signals, with the second threshold value corresponding to a value between first ZCR values associated with music/voice signals and second ZCR values associated with noise (e.g., second ZCR values are higher than first ZCR values).

The device 110 may determine (1016) whether the envelope ratio value is above a third threshold value. For example, the device 110 may use the envelope ratio to differentiate between noise/silence and voice signals, with the third threshold value corresponding to a value between first envelope ratio values associated with noise/silence and second envelope ratio values associated with voice signals (e.g., second envelope ratio values are higher than first envelope ratio values).

The device 110 may determine (1018) a difference between the first energy level ratio and the second energy level ratio and determine (1020) whether the difference is positive. For example, the difference is positive when the first energy level ratio is larger than the second energy level ratio, which corresponds to voice signals, and the difference is negative when the first energy level ratio is smaller than the second energy level ratio, which corresponds to music signals. Thus, the device 110 may identify voice signals as the lower frequency bands have more energy relative to the full-band signal than music signals, and the device 110 may identify music signals as the higher frequency bands have more energy relative to the full-band signal than voice signals.

Based on steps 1010-1020, the device 110 may determine (1022) the audio category. For example, the device 110 may identify silence based on the first energy level value, may identify noise based on the ZCR value, may distinguish between silence/noise and voice signals based on the envelope ratio value, and may distinguish between voice signals and music signals based on the first energy level ratio and the second energy level ratio.

As illustrated in FIG. 10B, the device 110 may receive (950) indicators. The device 110 may determine (952) whether inAlarm is true (e.g., first binary value, such as a value of one), and if so, may select (954) a first audio category (e.g., alarm signals, which corresponds to a gain value of 0.0 dB).

If inAlarm is false (e.g., second binary value, such as a value of zero), the device 110 may determine (956) whether inTTS is true and, if so, may select (958) a second audio category (e.g., voice signals). If inTTS is false, the device 110 may determine (960) whether inVoIP is true, and if so, may select the second audio category in step 958.

If inVoIP is false, the device 110 may determine (962) whether inMusic is true and, if so, may extract (964) feature data and may analyze (966) the feature data, as discussed above with regard to FIG. 10A. By analyzing the feature data, the device 110 may determine an audio category based on the feature data. Therefore, the device 110 may select the second audio category (e.g., voice signals) in step 958, select (968) a third audio category (e.g., music signals), or may select (970) a fourth audio category (e.g., noise/silence). If inMusic is false, the device 110 may select the fourth audio category in step 970.

Figure 11:
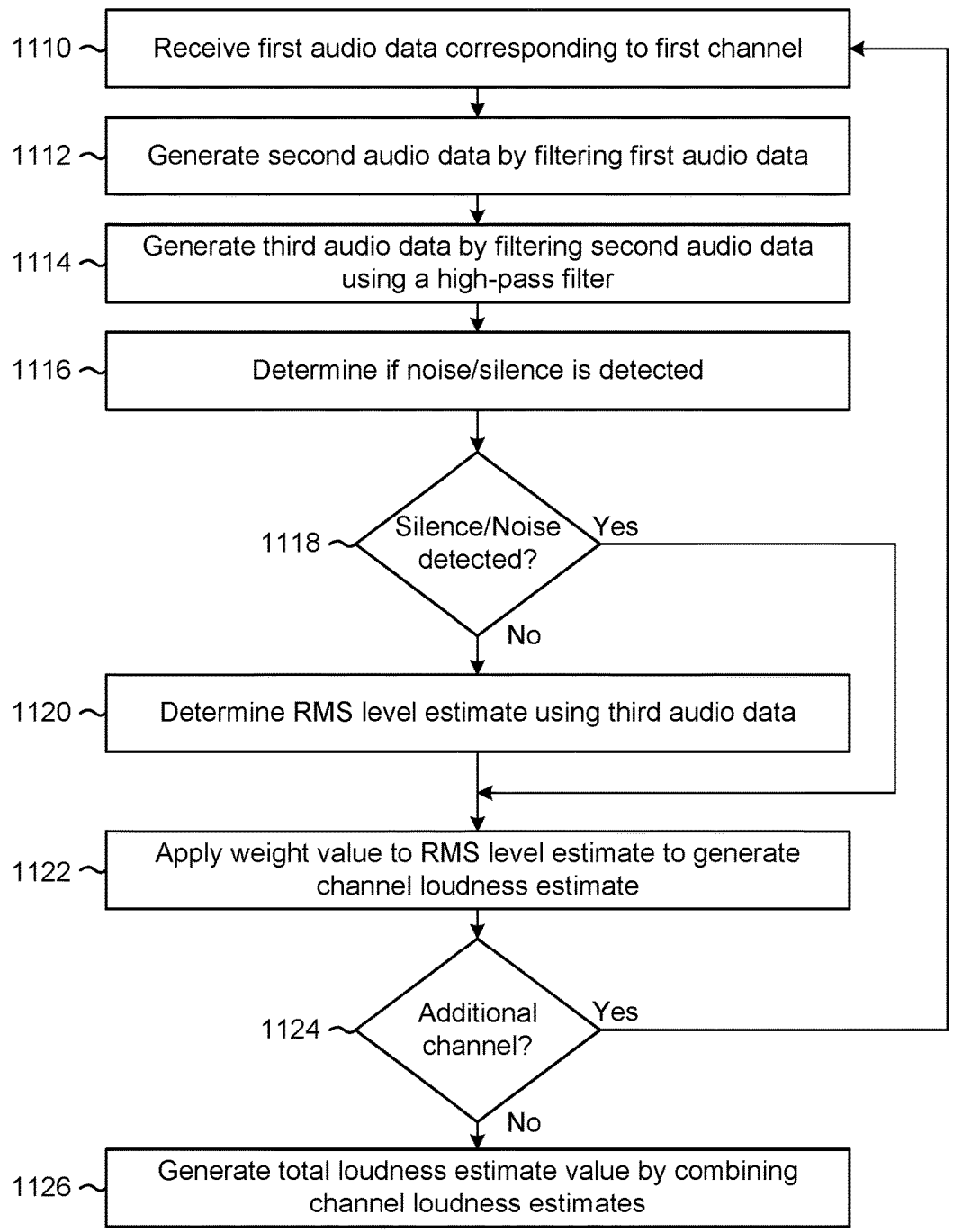
FIG. 11 is a flowchart conceptually illustrating an example method for determining a loudness estimate value according to embodiments of the present disclosure.

FIG. 11 is a flowchart conceptually illustrating an example method for determining a loudness estimate value according to embodiments of the present disclosure. As illustrated in FIG. 11, the device 110 may receive (1110) first audio data corresponding to a first channel of the input audio data, may generate (1112) second audio data by filtering the first audio data, and may generate (1114) third audio data by filtering the second audio data using a high-pass filter. For example, the device 110 may filter the first audio data using a K2-weighting filter that is a second order infinite impulse response (IIR) filter with a 100 Hz cutoff frequency, although the disclosure is not limited thereto. The high pass filter may be chosen based on a size of the loudspeaker(s) associated with the device 110, such as a 60 Hz cutoff frequency or a 300 Hz cutoff frequency.

The device 110 may determine (1116) if noise/silence is detected in the first audio data. For example, the device 110 may use the techniques discussed above with regard to the audio classifier 410 to detect noise/silence. If noise/silence is not detected, the device 110 may determine (1120) a root mean square (RMS) level estimate using the third audio data. For example, the device 110 may determine the RMS level estimate in a first time range of the third audio data. If silence/noise was detected in step 1116, the device 110 may freeze adaptation of the loudness estimate value and skip step 1120.

The device 110 may apply (1122) a weight value to the RMS level estimate to generate a channel loudness estimate. For example, for a stereo implementation, the weight value may correspond to a value of 0.5, whereas for a five channel implementation, the weight value may correspond to a value of 0.2.

The device 110 may determine (1124) whether there is an additional channel and, if so, may loop to step 1110 and repeat steps 1110-1122 for the additional channel. If the device 110 determines that there are no additional channels in step 1124, the device 110 may generate (1126) a total loudness estimate value by combining the channel loudness estimates calculated in 1122 for each channel of the input audio data.

Figure 12A:
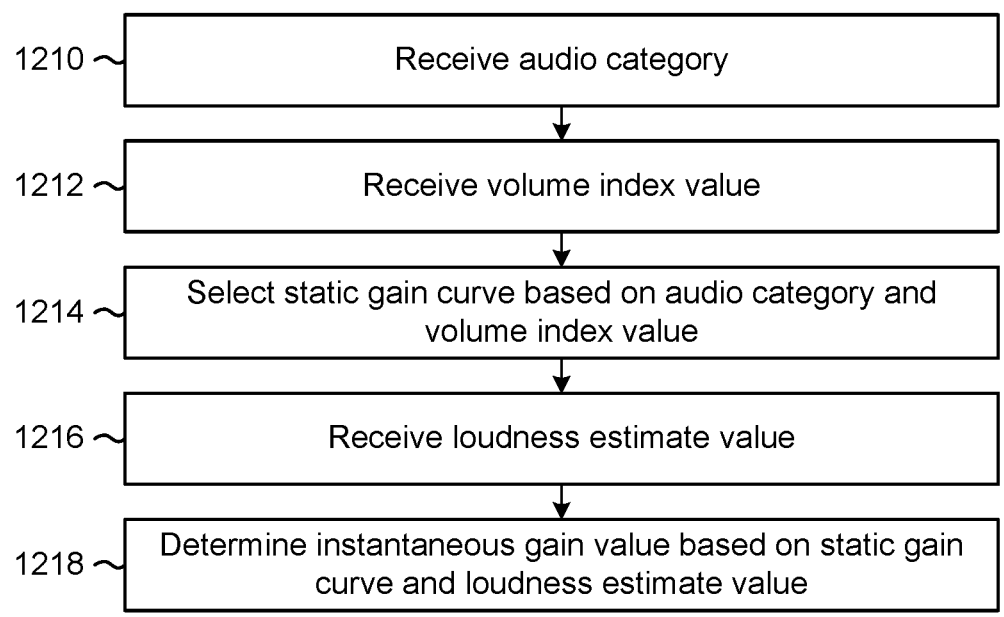
FIGS. 12A-12B are flowcharts conceptually illustrating example methods for determining an instantaneous gain value according to embodiments of the present disclosure.
Figure 12B:
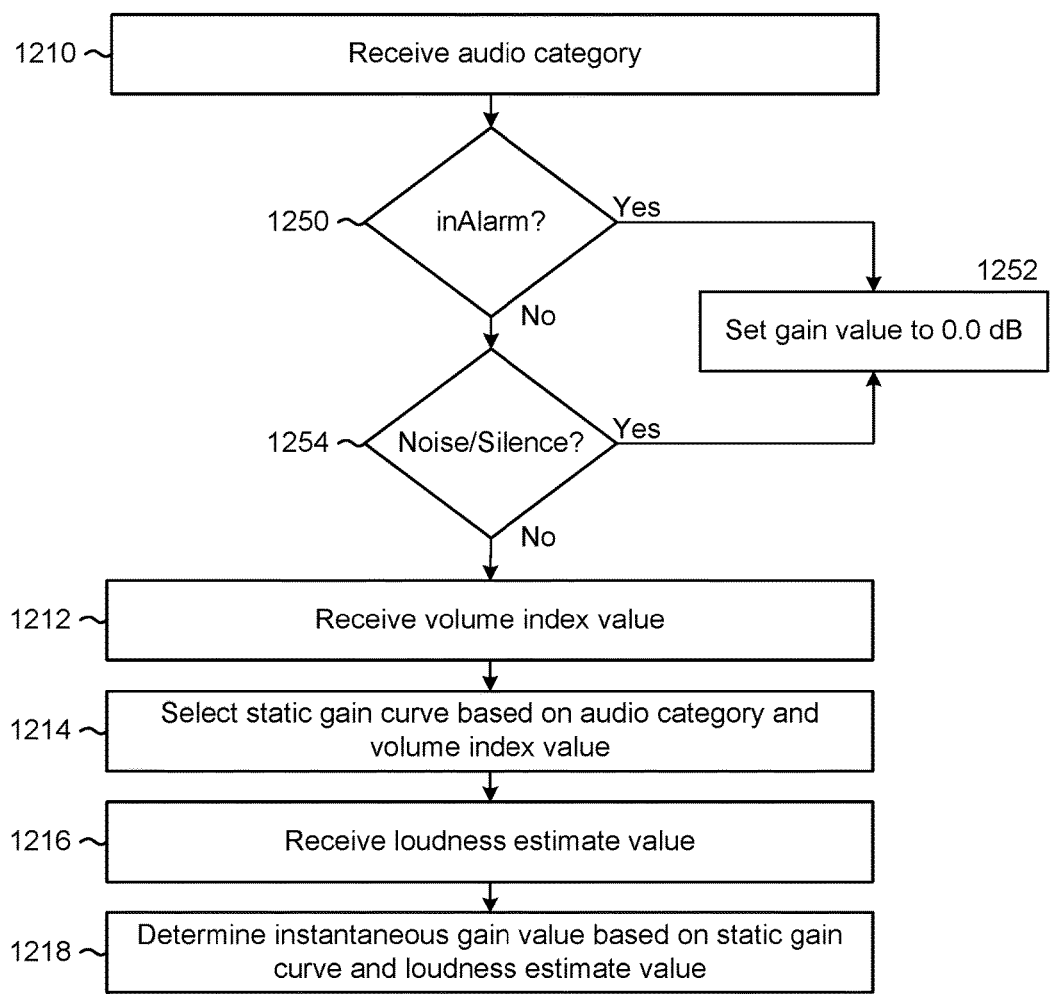

FIGS. 12A-12B are flowcharts conceptually illustrating example methods for determining an instantaneous gain value according to embodiments of the present disclosure. As illustrated in FIG. 12A, the device 110 may receive (1210) an audio category, may receive (1212) a volume index value and may select (1214) a static gain curve based on the audio category and the volume index value. For example, the device 110 may select a plurality of gain curves corresponding to the audio category and then select from the plurality of audio gain curves based on the volume index value.

The device 110 may receive (1216) a loudness estimate value and may determine (1218) an instantaneous gain value based on the static gain curve and the loudness estimate value. For example, the device 110 may select the gain value along the static gain curve that corresponds to the loudness estimate value.

As illustrated in FIG. 12B, the device 110 may receive (1210) the audio category, may determine (1250) whether inAlarm is true (e.g., first binary value, such as a value of one), and may determine (1252) whether noise/silence is detected. If inAlarm is true or noise/silence is detected, the device 110 may set (1252) a gain value to 0.0 dB.

If inAlarm is false (e.g., second binary value, such as a value of zero) and noise/silence is detected, the device 110 may perform steps 1212-1218, as discussed above with regard to FIG. 12A.

Figure 13A:
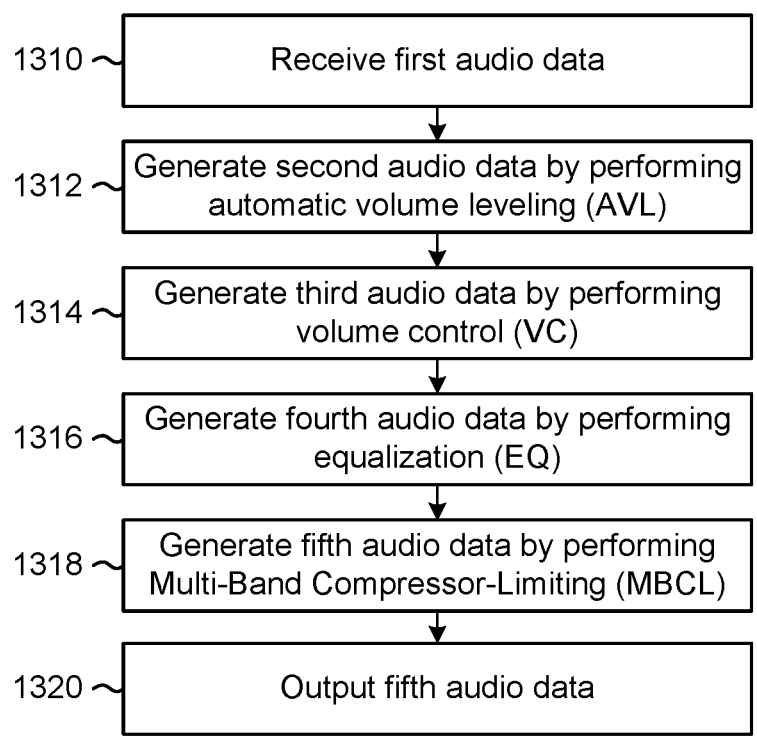
FIGS. 13A-13B are flowcharts conceptually illustrating example methods for performing automatic volume leveling in different audio paths according to embodiments of the present disclosure.
Figure 13B:
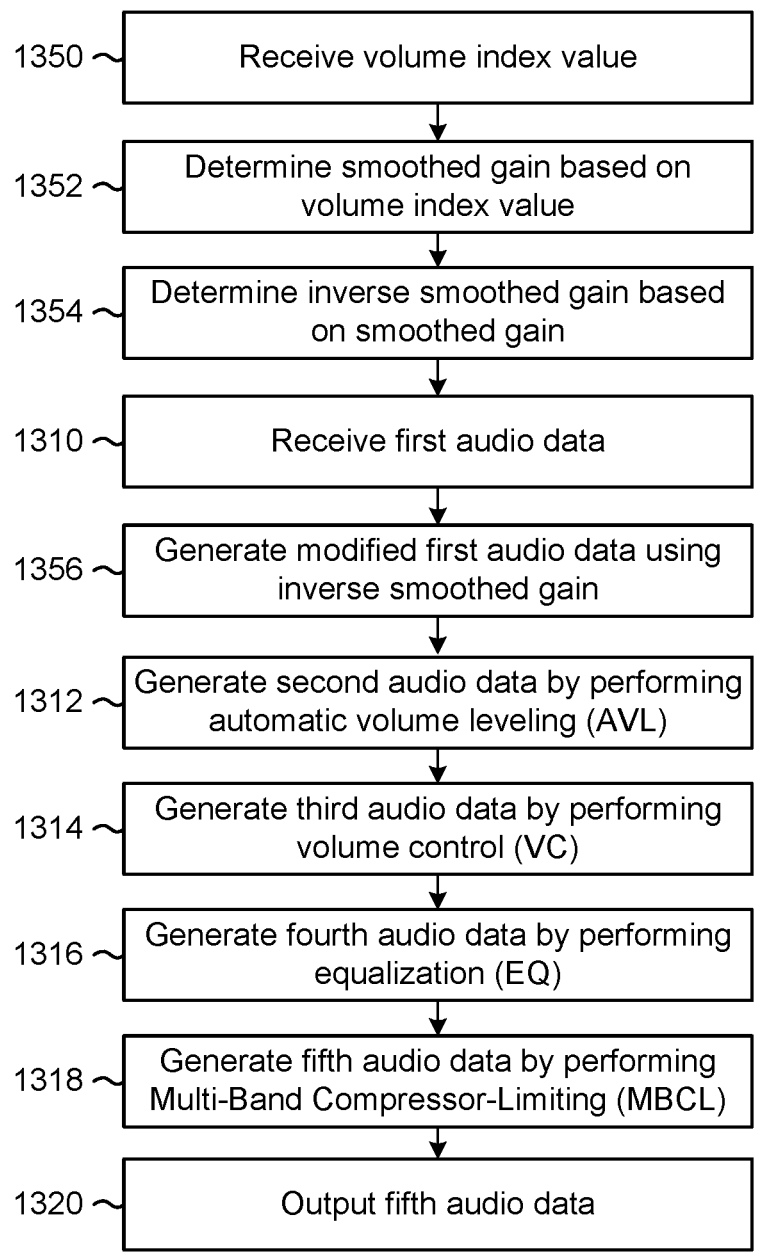

FIGS. 13A-13B are flowcharts conceptually illustrating example methods for performing automatic volume leveling in different audio paths according to embodiments of the present disclosure.

As illustrated in FIG. 13A, the device 110 may receive (1310) first audio data (e.g., raw input audio data) and may generate (1312) second audio data by performing automatic volume leveling (AVL). For example, the AVL 610 illustrated in FIG. 6A may receive raw input audio data and perform the AVL to generate the second audio data, which is output to the VC 612. The AVL 610 performs audio processing specific for the raw input audio data (or portions of the raw input audio data) based on the audio source, the audio category, the volume index value, and/or the like. Thus, the audio processing performed by the AVL 610 changes dynamically based on the raw input audio data.

The device 110 may generate (1314) third audio data based on the second audio data by performing volume control (VC) (e.g., embedded volume control). For example, the VC 612 may perform the volume control to generate the third audio data, which is output to the equalizer (EQ) 614. The audio processing performed by the VC 612 is intended to convert volume levels from a logarithmic scale (e.g., decibels) to a linear scale (e.g., volume value between 0.0-1.0). For example, the VC 612 may correspond to embedded volume control that converts from a logarithmic scale associated with the second audio data to a linear scale associated with the third audio data.

The device 110 may generate (1316) fourth audio data based on the third audio data by performing equalization (EQ) (e.g., apply different gain values to different frequency bands of the third audio data). For example, the EQ 614 may perform the equalization to generate the fourth audio data, which is output to the MBCL 616. The audio processing performed by the EQ 614 depends on settings and/or user preferences stored by the device 110 and/or applications running on the device 110. For example, equalization settings may be static for the device 110, may be user-specific (e.g., equalization settings change based on user profile), may be application or process specific (e.g., each process running on the device 110 has different equalization settings), and/or may be controlled by a user interface (e.g., enabling the user 5 to easily change the equalization settings). Thus, in some examples the equalization settings may vary depending on a time of day, a source of audio, an application, a genre of music, and/or the like.

The device 110 may generate (1318) fifth audio data based on the fourth audio data by performing multi-band compressor-limiting (MBCL). For example, the MBCL 616 may perform multi-band compression/limiting (e.g., compensate for distortion that is unique to one or more loudspeaker(s) associated with the device 110) to generate the fifth audio data, which is output as output audio data to be sent to one or more loudspeaker(s). The MBCL 616 performs audio processing specific for the one or more loudspeaker(s) that are associated with the device 110 and used to generate the output audio. Thus, the audio processing performed by the MBCL 616 is static for the device 110.

Finally, the device 110 may output (1320) the fifth audio data. For example, the device 110 may send the fifth audio data to the one or more loudspeaker(s) associated with the device 110 to generate output audio.

While FIG. 13A illustrates the device 110 receiving raw input audio data, the disclosure is not limited thereto and in other examples the device 110 may receive modified input audio data that has already been processed with volume control or other processing, as discussed above with regard to FIG. 6B. FIG. 13B illustrates a second example method corresponding to receiving modified input audio data, wherein the device 110 may perform an inverse operation to recover the raw input audio data prior to performing AVL and the other audio processing to generate the output audio data.

As illustrated in FIG. 13B, the device 110 may receive (1350) a volume index value, may determine (1352) a smoothed gain based on the volume index value, and may determine (1354) inverse smoothed gain based on the smoothed gain, as discussed above with regard to FIG. 6B. For example, the inverse volume control 632 illustrated in FIG. 6B may determine an inverse smoothed gain based on the smoothed gain (e.g., InverseSmoothedGain=1.0/smoothedGain).

The device 110 may then receive (1310) the first audio data and generate (1356) modified first audio data using the inverse smoothed gain. For example, the device 110 may use the inverse smooth gain and the first audio data to recover the raw input audio data, which corresponds to the input audio data prior to volume control being performed. The device 110 may then perform steps 1312-1320 using the modified first audio data in order to generate and output the fifth audio data.

FIG. 14 is a block diagram conceptually illustrating example components of the system 100. In operation, the system 100 may include computer-readable and computer-executable instructions that reside on the device 110, as will be discussed further below.

The device 110 may include one or more audio capture device(s), such as a microphone 112 or an array of microphones 112. The audio capture device(s) may be integrated into the device 110 or may be separate. The device 110 may also include an audio output device for producing sound, such as loudspeaker(s) 114. The audio output device may be integrated into the device 110 or may be separate. In some examples the device 110 may include a display, but the disclosure is not limited thereto and the device 110 may not include a display or may be connected to an external device/display without departing from the disclosure.

The device 110 may include an address/data bus 1424 for conveying data among components of the device 110. Each component within the device 110 may also be directly connected to other components in addition to (or instead of) being connected to other components across the bus 1424.

The device 110 may include one or more controllers/processors 1404, which may each include a central processing unit (CPU) for processing data and computer-readable instructions, and a memory 1406 for storing data and instructions. The memory 1406 may include volatile random access memory (RAM), non-volatile read only memory (ROM), non-volatile magnetoresistive (MRAM) and/or other types of memory. The device 110 may also include a data storage component 1408, for storing data and controller/processor-executable instructions. The data storage component 1408 may include one or more non-volatile storage types such as magnetic storage, optical storage, solid-state storage, etc. The device 110 may also be connected to removable or external non-volatile memory and/or storage (such as a removable memory card, memory key drive, networked storage, etc.) through the input/output device interfaces 1402.

Computer instructions for operating the device 110 and its various components may be executed by the controller(s)/processor(s) 1404, using the memory 1406 as temporary "working" storage at runtime. The computer instructions may be stored in a non-transitory manner in non-volatile memory 1406, storage 1408, or an external device. Alternatively, some or all of the executable instructions may be embedded in hardware or firmware in addition to or instead of software.

The device 110 includes input/output device interfaces 1402. A variety of components may be connected through the input/output device interfaces 1402, such as the microphone array 112, the loudspeaker(s) 114, and/or the display. The input/output interfaces 1402 may include A/D converters for converting the output of the microphone array 112 into microphone audio data, if the microphone array 112 is integrated with or hardwired directly to the device 110. If the microphone array 112 is independent, the A/D converters will be included with the microphone array 112, and may be clocked independent of the clocking of the device 110. Likewise, the input/output interfaces 1402 may include D/A converters for converting output audio data into an analog current to drive the loudspeakers 114, if the loudspeakers 114 are integrated with or hardwired to the device 110. However, if the loudspeakers 114 are independent, the D/A converters will be included with the loudspeakers 114 and may be clocked independent of the clocking of the device 110 (e.g., conventional Bluetooth loudspeakers).

The input/output device interfaces 1402 may also include an interface for an external peripheral device connection such as universal serial bus (USB), FireWire, Thunderbolt or other connection protocol. The input/output device interfaces 1402 may also include a connection to one or more networks 10 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of digital signal processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method, the method comprising:
   receiving a volume value for output audio, wherein the volume value indicates a percentage of a maximum output volume level;
   receiving first audio data to output using at least one loudspeaker;
   receiving a first source indicator indicating that the first audio data includes audio data from a streaming audio source;
   receiving a second source indicator indicating that the first audio data does not include audio data from a text-to-speech source;
   determining a plurality of energy level values of the first audio data;
   detecting, using the plurality of energy level values, the first source indicator, and the second source indicator, speech or music input in a first portion of the first audio data, the first portion of the first audio data corresponding to a first time range;
   determining a first loudness value, the first loudness value being equal to a root mean square amplitude of a plurality of amplitude values within the first portion of the first audio data;
   determining a first gain value, wherein the first gain value is based on the volume value, the speech or music input, and the first loudness value;
   generating second audio data by applying the first gain value to the first portion of the first audio data; and
   sending the second audio data to the at least one loudspeaker.

2. The computer-implemented method of claim 1, wherein determining the plurality of energy level values further comprises:
   determining a first energy level value of the first portion of the first audio data within a first frequency band, the first frequency band corresponding to a range from 300 Hz to 3 kHz;
   determining a second energy level value of the first portion of the first audio data within a second frequency band, the second frequency band corresponding to a range from 8 kHz to 16 kHz;
   determining a third energy level value of the first portion of the first audio data within a third frequency band, the third frequency band corresponding to a range from 100 Hz to 16 kHz;
   determining a first energy ratio value indicating a ratio of the first energy level value to the third energy level value;
   determining a second energy ratio value indicating a ratio of the second energy level value to the third energy level value;
   determining an upper envelope value of the first portion of the first audio data, the upper envelope value calculated using maximum values of the first portion of the first audio data;
   determining a lower envelope value of the first portion of the first audio data, the lower envelope value calculated using minimum values of the first portion of the first audio data;
   determining an envelope ratio value indicating a ratio of the upper envelope value to the lower envelope value; and
   determining a zero-crossing rate value associated with the first portion of the first audio data, the zero-crossing rate value indicating a rate at which an audio sample value changes from a positive value to a negative value or from a negative value to a positive value within the first portion of the first audio data.

3. The computer-implemented method of claim 2, wherein detecting the speech or music input further comprises:
   determining that the third energy level value is above a first threshold value, the first threshold value distinguishing silence from music and speech;
   determining that the zero-crossing rate value is below a second threshold value, the second threshold value distinguishing signal noise from music and speech;
   determining that the envelope ratio value is above a third threshold value, the third threshold value distinguishing speech from either silence or signal noise;
   determining that the first energy ratio value is above a fourth threshold value, the fourth threshold value distinguishing speech from music; and
   determining that the second energy ratio value is below a fifth threshold value, the fifth threshold value distinguishing speech from music.

4. The computer-implemented method of claim 1, further comprising:
   detecting audible sound in a second portion of the first audio data, the second portion of the first audio data corresponding to a second time range after the first time range;
   determining instantaneous loudness values of the second portion of the first audio data;
   determining a second loudness value for the second portion of the first audio data using the instantaneous loudness values;
   receiving a second volume value different than the volume value;
   determining absence of audible sounds in a third portion of the first audio data, the third portion of the first audio data corresponding to a third time range after the second time range;
   maintaining the second loudness value for the third portion of the first audio data, such that the second loudness value remains static during the third time range;
   determining a second gain value, wherein the second gain value is determined using the second volume value, the speech or music input, and the second loudness value; and
   generating third audio data by applying the second gain value to the third portion of the first audio data.

5. A computer-implemented method comprising:
   receiving a volume value;
   receiving first audio data;
   determining a first audio category associated with the first audio data;
   determining a first loudness value corresponding to the first audio data;
   determining a first gain value, wherein the first gain value is based on the volume value, the first audio category, and the first loudness value;
   generating second audio data corresponding to the first audio data based on the first gain value;
   sending the second audio data to at least one loudspeaker;
   receiving a second volume value;
   determining a plurality of gain values, wherein the plurality of gain values are based on the second volume value and the first audio category;
   determining a second gain value based on the plurality of gain values and the first loudness value; and
   generating third audio data corresponding to the first audio data based on the second gain value.

6. The computer-implemented method of claim 5, wherein determining the first audio category further comprises:
   determining a first energy level value associated with a first portion of the first audio data in a first frequency band;
   determining a second energy level value associated with a second portion of the first audio data in a second frequency band;
   determining a third energy level value associated with a third portion of the first audio data in a third frequency band, the third frequency band including at least the first frequency band and the second frequency band;
   determining a first energy ratio value indicating a ratio of the first energy level value to the third energy level value;
   determining a second energy ratio value indicating a ratio of the second energy level value to the third energy level value;
   determining an envelope ratio value indicating a ratio of an upper envelope value of the first audio data to a lower envelope value of the first audio data;
   determining a zero-crossing rate value associated with the first audio data; and
   determining the first audio category based on the third energy level value, the first energy ratio value, the second energy ratio value, the envelope ratio value and the zero-crossing rate value.

7. The computer-implemented method of claim 5, wherein determining the first audio category further comprises:
   receiving a first indicator associated with the first audio data, the first indicator indicating that the first audio data is associated with a first type of audio;
   receiving a second indicator associated with the first audio data, the second indicator indicating that the first audio data is not associated with a second type of audio; and
   determining the first audio category based on the first indicator and the second indicator.

8. The computer-implemented method of claim 5, further comprising:
   receiving third audio data;
   determining a second audio category associated with the third audio data;
   determining a second loudness value corresponding to the third audio data;
   determining a third gain value, wherein the third gain value is based on the volume value, the second audio category, and the second loudness value; and
   generating, based on the third gain value, fourth audio data corresponding to the third audio data, wherein a difference between a first maximum power value associated with the fourth audio data and a second maximum power value associated with the second audio data is below a threshold value.

9. The computer-implemented method of claim 5, further comprising:
   detecting that a first portion of the first audio data corresponds to at least one of music or speech;
   determining a second loudness value associated with the first portion of the first audio data;
   determining a third gain value based on the volume value, the first audio category, and the second loudness value; and
   generating, based on the third gain value, a first portion of the second audio data corresponding to the first portion of the first audio data.

10. The computer-implemented method of claim 9, further comprising:
   determining absence of audible sounds in a second portion of the first audio data;
   maintaining the second loudness value within the second portion of the first audio data; and
   generating, based on the third gain value, a second portion of the second audio data corresponding to the second portion of the first audio data.

11. The computer-implemented method of claim 5, further comprising:
   determining gain curve data based on the volume value;
   generating third audio data from the first audio data using an inverse function of the gain curve data;
   generating, based on the first gain value, fourth audio data corresponding to the third audio data; and
   generating the second audio data by applying the gain curve data to the fourth audio data.

12. The computer-implemented method of claim 5, wherein determining the first audio category further comprises:
   determining a first energy level value associated with a first portion of the first audio data in a first frequency band;
   determining a second energy level value associated with a second portion of the first audio data in a second frequency band;
   determining a third energy level value associated with a third portion of the first audio data in a third frequency band, the third frequency band including at least the first frequency band and the second frequency band;
   determining a first energy ratio value indicating a ratio of the first energy level value to the third energy level value;
   determining a second energy ratio value indicating a ratio of the second energy level value to the third energy level value; and
   determining, based on the first energy ratio value and the second energy ratio value, that the first audio category corresponds to speech and not music.

13. The computer-implemented method of claim 5, wherein determining the first audio category further comprises:
   determining a lower envelope value associated with the first audio data;
   determining an upper envelope value associated with the first audio data;
   determining an envelope ratio value indicating a ratio of the upper envelope value to the lower envelope value; and
   determining, based on the envelope ratio value, that the first audio category corresponds to speech and not noise.

14. The computer-implemented method of claim 5, wherein determining the first audio category further comprises:
   determining a zero-crossing rate value associated with the first audio data; and
   determining, based on the zero-crossing rate value, that the first audio category corresponds to noise.

15. The computer-implemented method of claim 5, wherein determining the first audio category further comprises:
   determining a full-band energy level value associated with the first audio data; and
determining, based on the full-band energy level value, that the first audio category corresponds to silence.

16. A system, comprising:
   at least one processor;
   memory including instructions operable to be executed by the at least one processor to cause the system to:
      receive a volume value;
      receive first audio data;
      determine a lower envelope value associated with the first audio data;
      determine an upper envelope value associated with the first audio data;
      determine an envelope ratio value indicating a ratio of the upper envelope value to the lower envelope value;
      determine, based on the envelope ratio value, that a first audio category associated with the first audio data corresponds to speech and not noise;
      determine a first loudness value corresponding to the first audio data;
      determine a first gain value, wherein the first gain values are based on the volume value, the first audio category, and the first loudness value;
      generate second audio data corresponding to the first audio data based on the first gain value; and
      send the second audio data to at least one loudspeaker.

17. The system of claim 16, wherein the memory further comprises instructions that, when executed by the at least one processor, further cause the system to:
   determine a first energy level value associated with a first portion of the first audio data in a first frequency band;
   determine a second energy level value associated with a second portion of the first audio data in a second frequency band;
   determine a third energy level value associated with a third portion of the first audio data in a third frequency band, the third frequency band including at least the first frequency band and the second frequency band;
   determine a first energy ratio value indicating a ratio of the first energy level value to the third energy level value;
   determine a second energy ratio value indicating a ratio of the second energy level value to the third energy level value;
   determine an envelope ratio value indicating a ratio of an upper envelope value of the first audio data to a lower envelope value of the first audio data;
   determine a zero-crossing rate value associated with the first audio data; and
   determine the first audio category based on the third energy level value, the first energy ratio value, the second energy ratio value, the envelope ratio value, and the zero-crossing rate value.

18. The system of claim 16, wherein the memory further comprises instructions that, when executed by the at least one processor, further cause the system to:
   receive third audio data;
   determine a second audio category associated with the third audio data;
   determine a second loudness value corresponding to the third audio data;
   determine a second gain value, wherein the second gain value is based on the volume value, the second audio category, and the second loudness value; and
   generate, based on the second gain value, fourth audio data corresponding to the third audio data, wherein a difference between a first maximum power value associated with the fourth audio data and a second maximum power value associated with the second audio data is below a threshold value.

19. The system of claim 16, wherein the memory further comprises instructions that, when executed by the at least one processor, further cause the system to:
   determine gain curve data based on the volume value;
   generate third audio data from the first audio data using an inverse function of the gain curve data;
   generate, based on the first gain value, fourth audio data corresponding to the third audio data; and
   generate the second audio data by applying the gain curve data to the fourth audio data.

20. A computer-implemented method comprising:
   receiving a volume value;
   receiving first audio data;
   determining a first audio category associated with the first audio data;
   determining a first loudness value corresponding to the first audio data;

determining a first gain value, wherein the first gain value is based on the volume value, the first audio category, and the first loudness value;

determining gain curve data based on the volume value;

generating second audio data from the first audio data using an inverse function of the gain curve data;

generating, based on the first gain value, third audio data corresponding to the second audio data;

generating fourth audio data by applying the gain curve data to the third audio data, the fourth audio data corresponding to the first audio data; and sending the fourth audio data to at least one loudspeaker.

21. A computer-implemented method comprising:

receiving a volume value;

receiving first audio data;

receiving a first source indicator indicating that the first audio data does not include audio data from a text-to-speech source;

determining a plurality of energy level values of the first audio data;

determining, using the plurality of energy level values and the first source indicator, that a first audio category associated with the first audio data corresponds to speech or music input;

determining a first loudness value corresponding to the first audio data;

determining a first gain value, wherein the first gain value is based on the volume value, the first audio category, and the first loudness value;

generating second audio data corresponding to the first audio data based on the first gain value; and sending the second audio data to at least one loudspeaker.

* * * * *